United States Patent
Neyts et al.

(10) Patent No.: US 10,964,857 B2
(45) Date of Patent: Mar. 30, 2021

(54) PLANAR ALIGNED NANORODS AND LIQUID CRYSTAL ASSEMBLIES

(71) Applicant: UNIVERSITEIT GENT, Ghent (BE)

(72) Inventors: Kristiaan Neyts, Ghent (BE); Jeroen Beeckman, Hillegem (BE); Mohammad Mohammadimasoudi, Noorsalehi Tehran (IR)

(73) Assignee: UNIVERSITES GENT, Ghent (BE)

(*) Notice: Subject to any disclaimer, the term of this patent is extended or adjusted under 35 U.S.C. 154(b) by 0 days.

(21) Appl. No.: 15/578,513

(22) PCT Filed: May 18, 2016

(86) PCT No.: PCT/EP2016/061166
§ 371 (c)(1),
(2) Date: Nov. 30, 2017

(87) PCT Pub. No.: WO2016/192995
PCT Pub. Date: Dec. 8, 2016

(65) Prior Publication Data
US 2018/0158997 A1    Jun. 7, 2018

(30) Foreign Application Priority Data
May 30, 2015   (EP) .................................... 15170004

(51) Int. Cl.
*H01L 33/50* (2010.01)
*B82Y 40/00* (2011.01)
(Continued)

(52) U.S. Cl.
CPC ............. *H01L 33/505* (2013.01); *B82Y 40/00* (2013.01); *C09K 11/025* (2013.01); *C09K 11/56* (2013.01);
(Continued)

(58) Field of Classification Search
CPC ......... B82Y 30/00; B82Y 40/00; B82Y 20/00; C09K 19/12; C09K 19/3458; C09K 19/52; C09K 19/54; C09K 19/56; G02F 2202/36
See application file for complete search history.

(56) References Cited

U.S. PATENT DOCUMENTS 8,471,969 B2 *  6/2013  Banin .................... B82Y 20/00
                                                            349/17
9,346,997 B2 *  5/2016  Bard ...................... B82Y 15/00
(Continued)

FOREIGN PATENT DOCUMENTS

WO           2012174533 A2    12/2012
WO    WO 2012174533 A2 *  12/2012 ............... C08K 7/02
(Continued)

OTHER PUBLICATIONS

Extended European Search Report from EP Application No. EP 15170004, dated Jul. 31, 2015.
(Continued)

*Primary Examiner* — Stephen M Bradley
(74) *Attorney, Agent, or Firm* — Workman Nydegger

(57) ABSTRACT

A method is described for preparing a nanorods assembly. The method comprises providing a mixture comprising at least a liquid crystal and nanorods and depositing said mixture on the surface of at least substrate. The method further comprises aligning said nanorods with their long axis of the nanorods along a preferred direction on said substrate resulting in a nanorods and liquid crystal assembly, said aligning being performed by applying an external alternating current electrical field.

20 Claims, 14 Drawing Sheets

(51) Int. Cl.
*G02B 5/30* (2006.01)
*G02F 1/13357* (2006.01)
*C09K 19/00* (2006.01)
*C09K 11/56* (2006.01)
*C09K 11/88* (2006.01)
*C09K 11/02* (2006.01)
*C09K 19/56* (2006.01)
*B82Y 30/00* (2011.01)
*C09K 19/52* (2006.01)
*H01L 21/02* (2006.01)
*C09K 19/54* (2006.01)
*G02F 1/1335* (2006.01)

(52) U.S. Cl.
CPC ............ *C09K 11/881* (2013.01); *C09K 19/00* (2013.01); *C09K 19/56* (2013.01); *G02B 5/3016* (2013.01); *G02B 5/3025* (2013.01); *G02F 1/13362* (2013.01); *B82Y 30/00* (2013.01); *C09K 2019/521* (2013.01); *C09K 2019/546* (2013.01); *C09K 2219/00* (2013.01); *G02B 2207/101* (2013.01); *G02F 1/133614* (2021.01); *G02F 1/133621* (2013.01); *G02F 2202/106* (2013.01); *H01L 21/0256* (2013.01); *H01L 21/02557* (2013.01); *H01L 21/02628* (2013.01); *H01L 33/502* (2013.01); *H01L 2933/0041* (2013.01); *Y10S 977/762* (2013.01); *Y10S 977/824* (2013.01); *Y10S 977/952* (2013.01)

(56) References Cited

U.S. PATENT DOCUMENTS

2009/0261815 A1* 10/2009 Cairns .................. B81B 3/0021
                                                      324/149
2012/0118368 A1* 5/2012 Huang .................. B82Y 10/00
                                                      136/256
2013/0077038 A1* 3/2013 Rho ........................ B82Y 20/00
                                                      349/144
2014/0319563 A1* 10/2014 Cao .......................... C08K 7/02
                                                      257/98
2015/0346522 A1* 12/2015 Hilarius ................ G02F 1/0316
                                                      359/259
2016/0089842 A1* 3/2016 Cakmak .............. B29C 71/0072
                                                      264/437
2017/0031186 A1* 2/2017 Moriwaki ........... G02F 1/13725
2017/0307939 A1* 10/2017 Banin ............... G02F 1/133617

FOREIGN PATENT DOCUMENTS

WO    WO 2014194206 A1 * 12/2014 ......... B29C 71/0072
WO    WO-2015152008 A1 * 10/2015 ......... G02F 1/13725

OTHER PUBLICATIONS

International Search Report from PCT Application No. PCT/EP2016/061166, dated Jul. 5, 2016.

Lynch et al., "Organizing Carbon Nanotubes with Liquid Crystals," Nano Letters, vol. 2, No. 11, dated Sep. 28, 2002, pp. 1197-1201.

Mohammadimasoudi et al., "Polarized Light Emission by Deposition of Aligned Semiconductor Nanorods," Proceedings of SPIE, vol. 9170, 2014, pp. 1-7.

Mukhina et al., "Electrically Controlled Polarized Photoluminescence of CdSe/ZnS Nanorods Embedded in a Liquid Crystal Template," Nanotechnology, vol. 23, Jul. 23, 2012, pp. 1-6.

Ryan et al., "Electric-Field-Assisted Assembly of Perpendicularly Oriented Nanorod Superlattices," Nano Letters, vol. 5, No. 7, 2006, pp. 1479-1482.

* cited by examiner

PLANAR ALIGNED NANORODS AND LIQUID CRYSTAL ASSEMBLIES

FIELD OF THE INVENTION

The invention relates to the field of aligned nanorods assemblies. More specifically it relates to the use of a mixture of a liquid crystal and nanorods for preparing a laterally aligned nanorods assembly.

BACKGROUND OF THE INVENTION

Nanorods are anisotropic nanocrystals having a long axis and a short axis. The nanorod's structural anisotropy gives rise to anisotropic physical characteristics, displaying polarized optical, electronic, magnetic, and electric properties at the nanometer scale. An ability to assemble these nanorods into ordered assemblies with sizes that range from the microscopic to the macroscopic scale is critical for development of devices and applications based on the anisotropic physical properties. The dimensions of the ordered nanorods assemblies limit the size of nanorod-based devices. The degree of order or alignment in a nanorods assembly further determines the overall quality of a device. These nanorods-based devices include solar cells, photodetectors, lasers, thermoelectric applications and polarized light emitting devices (LED). Specifically, polarized LEDs permit decreased energy requirements and improved contrast, particularly during daytime use, when used in display applications. Moreover, the construction of nanorod-based LEDs requires lateral alignment of nanorods on a larger area surface.

In prior art several techniques have been described which have been used to laterally align nanorods, like for stretching a polymer composite filled with nanorods. However, these techniques have not resulted in large-sized nanorods assemblies with a high degree of order, but only those with dimensions of only a few micrometers.

Hence there remains a need to achieve nanorods assemblies that can be prepared with large dimensions and have good lateral alignment of the nanorods.

SUMMARY OF THE INVENTION

It is an object of embodiments of the present invention to provide methods and devices to achieve nanorods assemblies that provide both a high nanorod density and a good homogeneity, wherein little or no clustering of the nanorods occurs.

It is an advantage of embodiments of the present invention that nanorod assemblies can be obtained that can be prepared with large dimensions while having a good lateral alignment of the nanorods.

It is an advantage of embodiments of the present invention that nanorod assemblies comprising aligned nanorods can be obtained and used in anisotropic light emitters.

Nanorods, and more specifically semiconductor nanorods, mainly absorb and emit light with the electric field along the long axis of the rods, it is therefore important to align the nanorods along a preferred direction. The latter can be obtained in embodiments according to the present invention.

It is an advantage of embodiments of the present invention that nanorods are used which are capable to control and optimize material properties.

It is an advantage of embodiments of the present invention that the position and orientation of nanorods or nanorod assemblies in a device can be controlled which is an important technologic advantage. In particular, as nanorods exhibit anisotropic absorption, spontaneous and stimulated emission, aligning individual nanorods to a preferred axis according to embodiments of the invention is attractive for applications in photovoltaic energy conversion, light-emitting devices (i.e. back light of LCDs), optical sensors, switches, etc.

It is an advantage that embodiments of the invention provide methods, based on electric-field-driven deposition and alignment from colloidal suspensions, which have proven to be efficient for the controlled positioning and alignment of nanorods, and can be applied to all kinds of anisotropic particles such as nanorods (i.e. semiconductor and gold), nanowires, and carbon nanotubes.

It is an advantage of embodiments of the present invention where CdSe/CdS nanorods are used, that when a field is applied of at least 20 μm/V at 1 kHz that the nanorods are aligned and declustered. It is possible that embodiments of the present invention can be made compatible with roll to roll fabrication.

It is an advantage of embodiments of the present invention that aggregation between the nanorods can be avoided, such that a more homogeneous distribution of the nanorods is obtained.

It is another advantage of embodiments of the present invention that methods are provided for homogeneous deposition of aligned nanorods on large substrates, which is advantageous for large size applications such as solar cells and (O)LEDs.

It is an advantage of embodiments of the present invention that in applications using aligned nanorods contrast can be high.

The above objective is accomplished by a method and device according to the present invention.

The present invention in one aspect relates to a method for preparing a nanorods assembly, the method comprising:
providing a mixture comprising at least a liquid crystal and nanorods;
depositing said mixture on the surface of at least substrate comprising electrical contacts for applying an electric field, aligning said nanorods with their long axis along a preferred direction on said substrate resulting in a nanorods and liquid crystal assembly, said aligning being performed by applying an external alternating current (AC) electrical field.

Said alignment may be orienting the nanorods with their long axis along a common direction, which may be referred to as the preferred direction.

It was surprisingly found that combining the use of an electric field and a mixture of liquid crystals in combination with nanorods resulted in a both well aligned and homogeneous distribution of the nanorods. When being positioned in an electric field, the mixture combines the ability to align the nanorods with an anti-clustering effect.

The applied alternating current external electric field may have an electric field amplitude between 1V/μm and 50V/μm, e.g. between 3V/μm and 20V/μm. It may have an electric field strength in a range having a lower limit of 1 v/μm, or e.g. 3V/μm, or e.g. 4V/μm or e.g. 5V/μm or e.g. 7.5V/μm or e.g. 10V/μm and having a higher limit of e.g. 30V/μm or e.g. 25V/μm or e.g. 20V/μm.

The applied external alternating current electric field may be applied at a frequency in a range having a lower limit of 50 Hz, or 100 Hz or 200 Hz or 500 Hz and having an upper limit of 100 kHz, e.g. 50 kHz, e.g. 40 kHz. In some embodiments, the applied external alternating current electric field is applied at a frequency of 1 kHz.

At least one substrate may comprise a substrate comprising an electrode arrangement being a set of interdigitated electrodes on a single substrate.

The at least one electrode arrangement may comprise spaced-apart electrodes, the space between the electrodes defining microchannels at the surface of the at least one substrate for receiving the mixture.

A device may comprise two substrates and an electrode arrangement may be present comprising electrodes being positioned on the at least two substrates and being spaced apart thus forming a microchannel in between the substrates.

The microchannel(s) may have a cross-section greater than the long axes of said nanorods.

Depositing may comprise promoting a fluid flow of the mixture on the at least one surface of the substrate.

Depositing may comprise any of dip coating, doctor blading, spin coating, printing or providing a gravity flow of the mixture over the microchannel(s).

The method may further comprise converting, after said aligning has occurred, said mixture into a solid material.

Said converting may comprise solidifying said mixture using UV irradiation.

After solidifying, the solid material may be separated from said surface of said at least one substrate, said nanorods assemblies being imbedded within the solid material. It is to be noticed that the separation step may be performed on material that has been solidified in any suitable manner, not necessarily restricted to solidifying using UV irradiation.

Said mixture may be a polymerizable or cross-linkable material and said converting may comprise polymerization or cross-linking or said mixture may be a melt and said solid material may be the solidified glass and/or crystal from said melt.

Said separating may comprise delaminating said solid material with said imbedded nanorods assemblies from said surface of said substrate or said separating may comprise dissolving or decomposing said substrate.

Said method may be performed as a roll-to-roll process whereby said aligning is performed by rolling the at least one substrate over a roll where said electric field is applied.

In a further aspect, the present invention also relates to a nanorods assembly comprising a plurality of nanorods and liquid crystal molecules, wherein said nanorods and liquid crystal molecules are aligned along the long axis of said nanorods.

Said nanorods assembly may comprise a plurality of nanorods and liquid crystal molecules, wherein said nanorods and liquid crystal molecules are aligned along the long axis of said nanorods to form a nanorods assembly having a high polarization ratio.

Said nanorods may comprise CdSe/CdS, Au. Ag, Cu, Fe, Co, Ni, transition metal oxide, indium oxide, gallium oxide, CdSe, CdS. CdTe, ZnS, ZnSe, ZnTe. HgS, HgSe, HgTe, InP, InAs, GaP, GaAs, PbS, PbSe, PbTe, InCuS, InCuSe, InAgS, InAgSe, InAgTe, or any combination thereof and wherein the liquid crystal is a reactive or non-reactive liquid crystal.

The nanorods assembly may have a planar shape whereby the nanorods are anisotropic. The applied electric field varies with different aspect ratios.

In one aspect, the present invention furthermore relates to a polarizing photonic sheet, comprising a nanorod assembly as described above, embedded within or resting upon a substrate.

Said substrate may comprise an inorganic or organic conductor, semiconductor, or insulator.

Said substrate may comprise $Si_3N_4$, Si, $In_2O_3$, InAs, InP, GaP, GaAs, GaAlAs, gold, silver, graphene, and conducting polymers.

Said substrate may comprise a polymer.

Said polymer may be an elastomeric network, a thermoplastic, or a thermoset.

Said elastomeric network may be a cross-linked polydimethylsiloxane (PDMS).

The present invention also relates to a down-conversion device, comprising at least one polarizing photonic sheet as described above, at least one light emitting diode (LED), and at least one polarizer.

Said LED may be a GaN LED and the polarizing photonic sheet may comprise CdSe/CdS nanorods assemblies.

The present invention also relates to the use of liquid crystal molecules in a nanorods assembly for aligning and declustering nanorods in a nanorods assembly under an external alternating current electric field.

It is an advantage that embodiments of the present invention enable large-scale homogeneous deposition and strong alignment of nanorods, like for instance CdSe/CdS nanorods, by providing a mixture of nanorods and liquid crystals on a substrate and using an electric field. This fast and versatile method is based on mixing the nanorods with a liquid crystal and aligning the mixture, in addition to the self-alignment due to the presence of the liquid crystal molecules, for example by applying an external electric field and thereby providing an electrically driven alignment and distribution of nanorods, which can be controlled and adapted in function of the used nanorods and liquid crystal or the envisioned application.

In some embodiments, alignment of nanorods can be obtained parallel in between two substrates by applying the dip coating technique and applying an electric field in between the substrates. It is an advantage that large areas of oriented nanorods can be achieved.

It is an advantage that embodiments of the present invention are compatible with large-scale processing on cheap, flexible and transparent substrates. The thickness of the resulting sheet comprising the nanorods assemblies according to the invention is in the order of a few micrometer.

It is an advantage that in some embodiments infiltrating of said nanorods and liquid crystal in said at least one microchannel is performed by dip-coating, which is a low-cost procedure during which an external electric field may be applied to the mixture.

It is an advantage of embodiments of the present invention that a mixture is provided comprising nanorods dispersed in a liquid crystal, which is used for dip coating. Liquid crystals advantageously exhibit unique properties such as long-range orientational order and anisotropic optical and electronic properties in a certain temperature range while keeping the fluidic properties. Moreover, the advantageous self-organizing nature of these liquid crystals has been demonstrated in different configurations.

It is an advantage of embodiments of the present invention that the self-organizing properties of anisotropic liquid crystals in addition to the applied external electric field may aid in the alignment of anisotropic objects such as both metal and semiconductor nanorods, nanowires and nanotubes. Hybridization of two different material systems may lead to novel materials with interesting properties and resulting device applications.

It is an advantage of embodiments of the present invention that in preferred embodiments the nanoparticles are homogeneously dispersed in anisotropic fluids preferably without aggregation of the nanoparticles in the medium in sufficiently high concentration for applications.

In one embodiment, the nanorods are deposited in a microchannel on a substrate, for instance a glass substrate with patterned transparent indium tin oxide (ITO) interdigitated electrodes with a spacing of a few micrometers defining the microchannel.

It is an advantage that embodiments of the present invention, which provide electrically driven alignment enable the production of densely packed and aligned nanorods, and more specifically CdSe/CdS nanorods, and liquid crystal assembly. The latter is particularly advantageous for applications in the photovoltaic and field emission devices. Organic-inorganic hybrid photovoltaic devices, while having advantages of low cost, processability, and flexibility, suffer from lower efficiency of nanorod-based photovoltaics. Embodiments of the present invention provide oriented and packed nanorods which enhances the efficiency of such devices.

It is an advantage of embodiments of the present invention that nanorods are used which provide anisotropic absorption and whereby the enabled alignment (through the application of an external electric field) enhances the efficiency of the nanorods anisotropic absorption properties. It is an advantage of embodiments of the present invention that the applied external electric field may vary in function of the nanorods used and/or a different aspect ratio. In some embodiments the required electric field strength to align the nanorods, i.e. semiconductor nanorods, is preferably determined experimentally by examining the alignment of the nanorods, i.e. colloidal CdSe/CdS nanorods in non-reactive liquid crystal. In other embodiments a theoretical approach may be used to estimate the preferred applied external electrical field, based on numerical simulations. Reduction of clustering of the nanorods in liquid crystal is obtained by applying a high electric field (for example 3 V/µm (rms) at 1 kHz). The relaxation times and critical frequency of the nanorods in liquid crystal may be estimated experimentally and/or theoretically.

It is an advantage of embodiments of the present invention that semiconductor nanoparticles, like for instance nanorods, can be used to efficiently transform light, i.e. blue light from GaN-based LEDs into for example green or red light, which is also needed in color displays. The combination of blue, green and red light is desired for backlights in liquid crystal displays. As liquid crystal devices modulate the transmission of polarized light, it is an advantage to start from a backlight that is able to emit polarized green and red light. Embodiments of the present invention advantageously provide a method for the deposition of nanorods, i.e. semiconductor nanorods, on a substrate in which an external electric field aligns the nanorods in a preferred direction, controls the spatial distribution of said nanorods and moreover is able to de-cluster aggregated nanorods, for instance in the vicinity of electrodes. Embodiments of the present invention therefor preferably use a mixture based on at least mixing nanorods with liquid crystal (LC), and align the nanorods and the liquid crystal director by an externally applied electric field and finally polymerizing the film.

It is an advantage of methods of the present invention to provide an electrically driven declustering method for aggregated nanoparticles, such as nanorods which have a permanent dipole moment, therefor reducing the necessity of surfactant stabilization, which is a common method applied to reduce clustering as e.g. for the case of gold nanorods in lyotropic liquid crystal.

It is an advantage of methods of the present invention that the required electric field strength and critical frequency, as well as the required relaxation times can be obtained experimentally and tailored in function of the nanorods or liquid crystal used.

It is an advantage that a method according to the invention can be made compatible with large-scale processing on flexible transparent substrates.

It is an advantage that embodiments of the invention provide aligned nanorod assemblies with a polarization ratio of the emitted light as high as 0.60.

Embodiments of the present invention provide methods to homogeneously disperse and align nanorods, i.e. CdSe/CdS nanorods, in a polymer film. In specific embodiments, the fabrication uses a glass substrate with transparent interdigitated indium tin oxide electrodes. In preferred embodiments a mixture is provided where a reactive nematic liquid crystal is doped with nanorods and consequently aligned in the mixture by an electric field. The alignment may then be fixed after the polymerization reaction. The resulting solid film can be detached from the substrate. The resulting film emits polarized light when illuminated with unpolarized light of an appropriate wavelength.

In preferred embodiments the external electric field strength required to align and/or decluster nanorods, i.e. semiconductor nanorods, is determined experimentally. Application of a high external electric field, i.e. 20 V/µm at 1 kHz, advantageously yields reduction of clustering of nanorods in at least one liquid crystal medium. The permanent dipole moments, relaxation times and critical frequencies of the nanorods, i.e. semiconductor nanorods, may be estimated by experimental results.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 13(a) illustrates the situation with no external electrical field is applied, FIG. 13(b) illustrates the situation where an external electrical field has been applied, the applied electric field is perpendicular to the ITO electrodes.

Figure 1A:
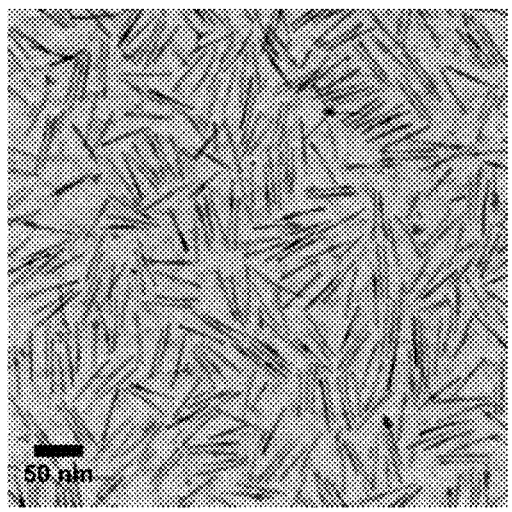
FIG. 1A shows a Transmission Electron Microscopy (TEM) image of CdSe/CdS nanorods used in a mixture according to embodiments of the invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "liquid crystal", reference is made to a matter in a state that has properties between those of conventional liquid and those of solid crystal. For instance, a liquid crystal may flow like a liquid, but its molecules may be oriented in a crystal-like way. When an electric field is applied to a liquid crystal layer, the long molecular axes tend to align parallel to the electric field.

Where in embodiments of the present invention reference is made to "aligned nanorods and liquid crystal assembly", reference is made to nanorods and liquid crystal molecules which have a planar alignment, thus in a plane, and preferably along a direction, and more preferably along an axis, whereby said direction, i.e. an axis, is perpendicular to the long axis of the nanorod or liquid crystal molecule. When such aligned nanorods and liquid crystal molecules are exposed to a UV source, a transition from planar to homeotropic alignment of a photosensitive nematic of the liquid crystal molecule can be induced. Illumination with UV light results in generation of cis-isomers which are selectively adsorbed onto the surface of the confining substrates due to their higher polarity compared to one of the trans-isomers. This, in turn, results in a homeotropic alignment of the liquid-crystal bulk.

Where in embodiments of the present invention reference is made to "large-scale", reference is made to substrates and polarizing photonic sheets having length and width dimensions in the order of a few mm, a few cm or higher. For the avoidance of doubt the thickness of the photonic sheets are preferably in the order of micrometers.

Where in embodiments of the present invention reference is made to a "surfactant", reference is made to an active substance which preferably chemically reacts with the surface of a nanorod.

Where in embodiments of the present invention reference is made to "a capping agent", reference is made to a substance that preferably encloses the nanorod and does not react with surface of the nanorod.

Wherein in embodiments of the present invention reference is made to "a polarization ratio", reference is made to a measure defined as the ratio of $(I_\parallel - I_\perp)/(I_\parallel + I_\perp)$, whereby $I_\parallel$ and $I_\perp$ are measured by averaging the photo luminescent intensity over a gap area between two electrodes, when a polarizer is oriented respectively parallel and perpendicular to a field that has been applied.

Embodiments of the invention are directed to a novel method of providing large-scale laterally aligned nanorods and liquid crystal assemblies to form thin films having nanorods and liquid crystal assemblies with good nanorod density and good homogeneity. Furthermore dimensions can be reached that can exceed a centimeter. Embodiments of the invention are directed to the nanorods and liquid crystal assemblies, which advantageously have high polarization ratios and can be used for polarized organic or inorganic light emitting devices.

Whereas in the following detailed description a plurality of examples is shown where the applied AC electric field is applied at 1 kHz, embodiments of the present invention are not limited thereto and other frequencies also can be used.

In a first aspect, the present invention relates to a method for preparing a nanorods assembly. The method comprises providing a mixture comprising at least a liquid crystal and nanorods and depositing the mixture on a surface of at least one substrate.

In preferred embodiments a mixture comprising at least a liquid crystal, preferably a nematic liquid crystal, more preferably a reactive nematic liquid crystal, and nanorods is provided whereby the nanorods, for instance CdSe/CdS nanorods, are dispersed in the liquid crystal preferably at a concentration of at least one nanorod in an amount from about 0.000001 to about 10 parts by weight per 100 parts by weight of the liquid crystal and preferably from an amount from about 0.1 to 2 parts by weight per 100 parts by weight of the liquid crystal. In a specific embodiment a mixture comprising CdSe/CdS nanorods dispersed in a nematic liquid crystal is provided in an amount of 1 parts by weight per 100 parts by weight of the liquid crystal (i.e. 1 w %). The nanorods (i.e. metallic, metal oxide, semiconductor or carbon nanotubes) may be added to the liquid crystal by any suitable method known in the art. For example, the nanorods can be mixed or suspended in an appropriate solvent such as a nontoxic organic or aqueous solvent, depending on their surface modifying compound. Examples of suitable solvents include for instance chloroform. The nanorod-solvent mixture can then be added to the liquid crystal-mixture followed by evaporation of organic solvent under reduced pressure such as by a vacuum pump. The amount of nanorods utilized ranges generally from about 0.000001 to about 10 parts, preferably from about 0.0001 to about 1 part or from about 0.001 to about 0.5 part per 100 parts by weight of liquid crystal.

The method also comprises aligning the nanorods along the long axis of the nanorods on the substrate resulting in a nanorods and liquid crystal assembly, whereby the aligning is performed by applying an external alternating current (AC) electrical field. It was surprisingly found that combining the use of an alternating current electric field and a mixture of liquid crystals in combination with nanorods resulted in both well aligned and homogeneous distribution of the nanorods. The liquid crystals thereby combine, when being positioned in an electric field, their ability to align with an anti-clustering effect. In some embodiments, the substrate is a single substrate comprising an electrode arrangement, e.g. a set of interdigitated electrodes, in between which alignment of the nanorods is obtained. The space between the electrodes then can define microchannels at the surface of the at least one substrate for receiving the mixture and for aligning them. According to some embodiments, two substrates are provided and an electrode arrangement is provided that comprises electrodes being positioned on the two substrates and being spaced apart thus forming a microchannel in between the substrates for receiving the mixture.

Further features and advantages will be illustrated with reference to particular embodiments and examples, the present invention not being limited thereby.

In embodiments of the invention an individual nanorod may be a nanoparticle having a large aspect ratio (e.g. length/radius>2) with a long dimension of about 0.010 to 50 microns and a radius of 1 to 100 nanometers. In further embodiments the nanorod may further comprise a dot, i.e. a quantum dot, within the nanorod. FIG. 1A illustrates a Transmission Electron Microscopy (TEM) image of selected nanostructures according to the teachings of the present invention. More specifically, FIG. 1A illustrates CdSe quantum dots (QDs) within CdS rods, the so called CdSe/CdS dot-in-rods, whereby the emission spectrum was recorded for an excitation wavelength of 365 nm and was corrected over the sensitivity of the detector.

In various embodiments, the nanorods may be formed by preparing a seed solution including a precursor material for the nanorods, preparing a growth solution including the precursor material, and mixing the seed solution and the growth solution.

In various embodiments, each nanorod may be free of a surfactant.

In other embodiments, each nanorod or the mixture comprising at least the nanorods and liquid crystals and may further comprise a photo-inhibitor, a photo-initiator or a combination thereof. The latter may be provided by means of a coating in a form of a surfactant or in the form of a capping agent. In specific embodiments nanorods, i.e. CdSe/CdS nanorods, are dispersed in a mixture of reactive nematic liquid crystal at a concentration of 1 w %, wherein the mixture is prepared by mixing a photo-initiator (for instance Irgacure 819, BASF®) with a blend of different reactive mono- and di-acrylate mesogens (Merck®) and a photo-inhibitor (for instance tert-Butylhydroquinone, Sigma-Aldrich). In preferred embodiments the mixture is homogeneous and preferably in a nematic phase. In addition three reactive liquid crystals may be mixed and the photo-inhibitor may be used to inhibit polymerization before UV illumination. The nanorod suspension in chloroform is mixed with LC and then the chloroform is evaporated.

Figure 1B:
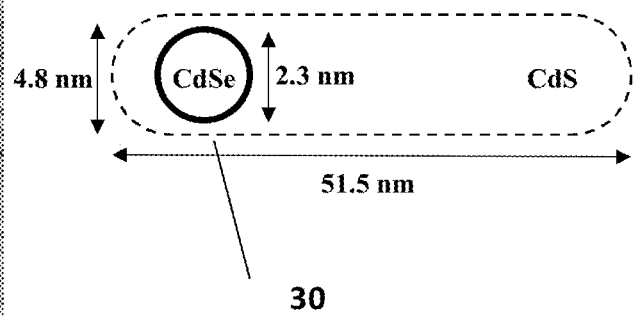
FIG. 1B schematically illustrates a CdS nanorod comprising a CdSe dot therein used in mixtures according to embodiments of the invention.

In specific embodiments CdSe/CdS nanorods are used, whereby said CdSe/CdS dot-in-rods may be synthesized according to procedures known in the art, for instance by preparing CdSe cores QDs from a mixture of 0.12 g of CdO, 6 g of trioctylphosphine oxide (TOPO) and 0.56 g of octadecylphosphonic acid (ODPA) which is degassed under vacuum at 120° C. for 1 hour. Next, the mixture is heated to 350° C. under nitrogen atmosphere and a mixture of 0.116 g of Se and 0.72 g of trioctylphosphine (TOP) is quickly injected. The reaction time is adjusted to obtain CdSe QDs with a diameter of 2.3 nm. The reaction is then quenched and the QDs are purified three times by centrifugation, using toluene and isopropanol as the solvent and the non-solvent respectively. The CdSe/CdS dot-in-rods are prepared from a mixture of 0.057 g of CdO, 3 g of TOPO, 0.25 g of ODPA and 0.08 g of hexylphosphonic acid (HPA) which is degassed under vacuum at 120° C. for 1 hour. Next, the mixture may be heated to 350° C. under nitrogen atmosphere and 1.8 ml of TOP are injected. Subsequently, at the same temperature 0.12 g of S in 1.8 ml of TOP and the above mentioned CdSe QDs are injected in the reaction mixture. The amount of CdSe cores is adjusted to obtain dot-in-rods with a diameter of 4.8 nm and a length of 51.5 nm, as illustrated schematically in FIG. 1B. The reaction is preferably quenched after 8 minutes and the dot-in-rods are preferably purified three times by centrifugation, using toluene and isopropanol as the solvent and the non-solvent respectively.

In preferred embodiments CdSe/CdS dot-in-rods are used as nanorods, as these particular anisotropic structures have a very high photoluminescence quantum yield of up to 75%. However other nanorods, in function of the application, may be used and selected by a skilled person.

In an exemplary embodiment a mixture comprising at least CdSe/CdS nanorods in a liquid crystal is used. CdSe/CdS dot-in-rods can be made by first synthesizing CdSe quantum dots with a wurtzite structure. On the core quantum dots an anisotropic CdS shell is grown using phosphonic acids as ligands to obtain CdSe/CdS dot-in-rods. These anisotropic structures advantageously have a high photoluminescence quantum yield which is reported to be up to 75%. After purification the CdSe/CdS nanorods are dispersed in a mixture of reactive nematic liquid crystal at a concentration of 1 w %. This mixture is prepared by mixing photo initiator (Irgacure 819, BASF) with a blend of different reactive mono- and di-acrylate mesogens (Merck) and photo inhibitor (tert-Butylhydroquinone, Sigma-Aldrich).

According to some embodiments of the present invention, an electrode arrangement can be present either in one substrate, in a set of substrates or external to a substrate for providing an electric field over the substrate.

Figure 2:
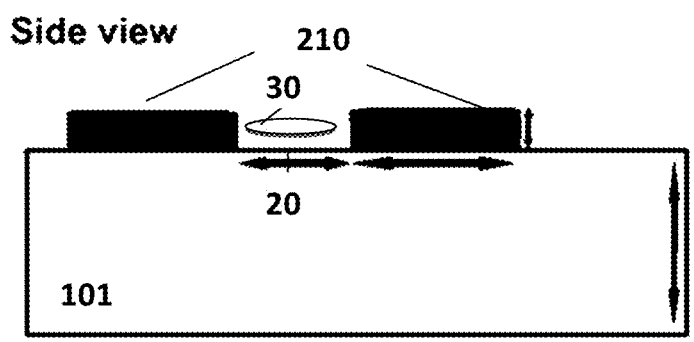
FIG. 2 schematically illustrates a cross section of a patterned substrate (not on scale) according to embodiments of the present invention, comprising an electrode arrangement, whereby said electrodes are spaced apart thereby defining a microchannel suitable for receiving a nanorod and/or liquid crystal molecules according to embodiments of the present invention.

According to some embodiments of the invention, the electric field is generated using a single substrate having an electrode arrangement on the substrate. The nanorods assemblies may be formed when a mixture of at least nanorods and liquid crystal are infused and aligned within at least one microchannel of for instance a patterned substrate. Preferably a patterned substrate, whereby said substrate comprising a structure of a plurality of protrusions. For many uses of the nanorods assemblies, the patterned substrate may be in the form of a sheet, where the sheet comprises a plurality of microchannels which are for instance defined by said plurality of protrusions. The patterned substrate can be an inorganic substrate, for example, a silicon substrate, Si3N4 coated silicon substrate or a metal or glass, or the patterned substrate can be a polymeric substrate, for example, a cross-linked polydimethylsiloxane (PDMS), polyvinyl alcohol (PVA), a thermoplastic, or a thermoset. The patterned substrate can be a conductor, a semiconductor, or an insulator. According to embodiments of the invention, the patterned substrate may comprise an assembly of electrodes provided on a substrate, for example a glass substrate and ITO electrodes, providing a transparent patterned substrate. This is for instance illustrate schematically in FIG. 2 which provides a side view of a patterned substrate according to the present invention. Where a substrate 101 with an arrangement of electrodes 200 is provided, whereby the electrodes 210 are spaced from each other, thereby defining a microchannel 20 having dimensions such to receive a nanorod 30 in its long axis. In some embodiments, the arrangement of electrodes may be in plane. This may include different conductive electrode (made of e.g. Au, Pt, Al, ITO or other conducting materials) configurations patterned on one plane. The nanorods may be deposited or infused such that they can occupy the region between the electrodes which define the microchannels. The conductive electrodes may be patterned on the substrate (for example glass, silicon, plastic) by using, for example, optical lithography, e-beam lithography, evaporation methods, electrochemical methods or soft-lithography. In embodiments of the invention the substrate or substrate assembly may be rigid or flexible, depending on the materials used.

In a specific embodiment preferably long rectangular electrodes 210, i.e. finger electrodes, are used in the electrodes arrangement 200, 201, for instance interdigitated electrodes may be used as an electrode arrangement, whereby the electrodes have a width of about 6 μm and a thickness of 30 nm and a region between the electrodes for example 4 or 6 μm such that the nanorods can be deposited thereon or infused therein. The thickness of the substrate in this specific embodiment is about 1.1 mm. When a mixture comprising at least nanorods and a liquid crystal according to the invention is infused or deposited on the patterned surface, the nanorods are preferably aligned, or by the liquid crystal molecules and/or by an external applied electric field, in an orientation perpendicular to the electrodes of the electrodes arrangement.

The shape and length of the microchannels can vary over wide range permitting one to match the patterns, dimensions, and nanorod densities to the application that employs the nanorods assemblies. According to some embodiments of the invention various designs and shapes of the electrode pattern may be provided for instance in function of a desired shape and/or functionality of the aligned nanorod assembly that is to be obtained. This may be for instance a rectangular or circular shape. The length of the microchannels can have dimensions of micrometers, millimeters, centimeters, or even meters. The nanorods assemblies can be in excess of 100 microns, in excess of a millimeter, in excess of a centimeter, or in excess of a meter, when the microchannel length is of these dimensions.

Figure 3:
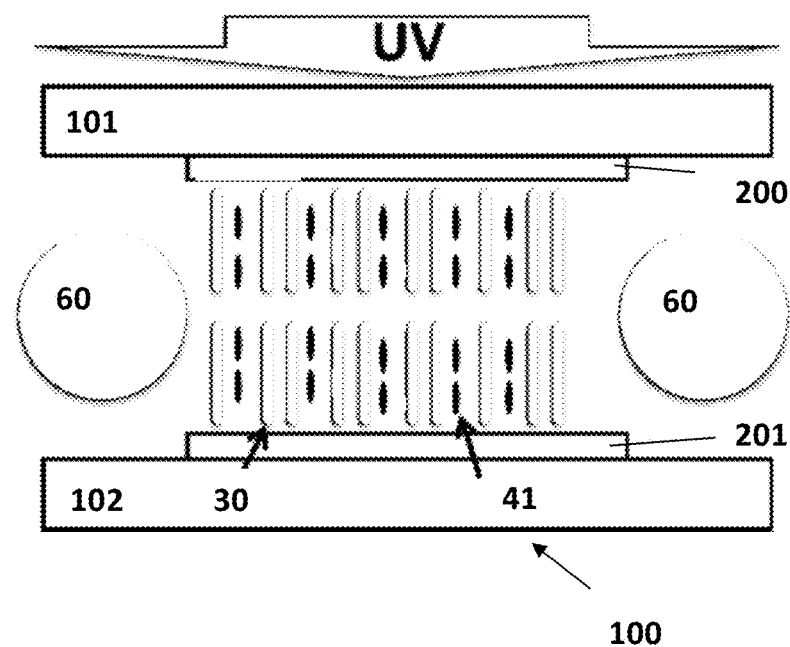
FIG. 3 schematically illustrates an embodiment of a substrate assembly in use according to embodiments of the present invention.

During the flow of the mixture over the substrate, the nanorods and liquid crystal that are approximately aligned with the microchannel enter and are trapped in the microchannels. Other nanorods and liquid crystal transport further on the surface of the substrate until their orientation is aligned with a microchannel and enters the microchannel at an unoccupied site for entry. The flow can be driven by for instance gravity where an edge of the substrate surface is elevated to position the surface at an angle to a plane surface at the base of a system for deposition in the microchannels. The flow can for instance be mechanically induced, for example, by spin casting, by dip-coating, or by drawing a roller or doctor blade across the surface with the microchannels and using an appropriate mechanical down-force that does not damage the nanorods. After introduction of a sufficient quantity of the mixture comprising the nanorods and liquid crystal, the channels have nanorods and the liquid crystal molecules infused in the microchannels, forming a continuously contacting assembly of nanorods and liquid crystal molecules as shown in FIG. 3 using a substrate assembly according to the present invention. Any residual mixture or any portion of the mixture can be removed from the substrate and nanorods assembly by any method that preferably does not affect the shape and orientation of the nanorods assemblies in a negative, undesired, manner and does not decompose the nanorods or liquid crystal molecules. The removal can occur by for instance devolatilization using a gas flow, heating, or evacuation or one may employ a solvent or solution that selectively washes a portion of the suspending liquid from the nanorods assembly. The removal can employ contacting the surface with an absorbent material to wick a portion of the suspending liquid from the nanorods assembly-formed in the microchannels. The liquid removal can result from the absorption of a portion of the mixture by the substrate material as long as swelling does not occur to an extent that the microchannels cannot retain the nanorods assembly, at least during the period of depositing the nanorods and liquid crystal molecules in the microchannels.

According to embodiments of the invention, the nanorods assemblies may be formed when a mixture of at least nanorods and liquid crystal are infused and aligned in a substrate assembly according to the present invention. FIG. 3 schematically illustrates such a substrate assembly in use, comprising a first 101 and second substrate 102, whereby both substrates are patterned with electrode arrangements 200, 201 providing microchannels (not shown). The substrates 101, 102 are preferably positioned such that the electrode arrangements 200, 201 face each other with a distance between them, in this specific embodiment provided by spacing means 60 in the form of spacing beads. By spacing the electrodes and defining a gap in between the two substrates, a mixture according to embodiments of the invention may be provided therein.

Figure 5:
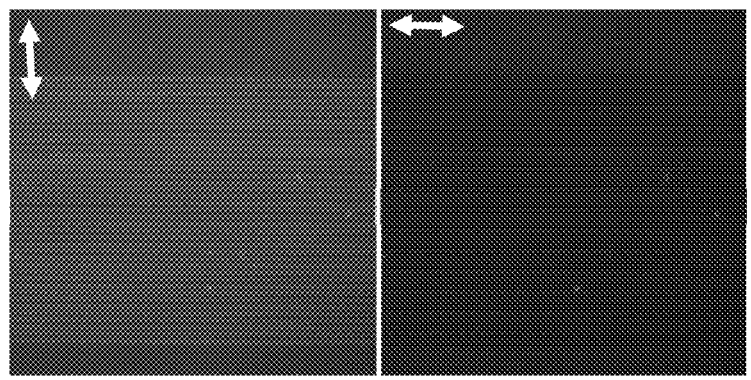
FIG. 5 shows fluorescence microscopy images of aligned nanorods assemblies using methods according to embodiments of the present invention whereby the mixture used comprises nanorods and glue, whereby the left image provides an image whereby the orientation of the polarizer is perpendicular to the alignment of the nanorods, and whereas the right image provides an image whereby the orientation of the polarizer is parallel to the alignment of the nanorods.
Figure 10:
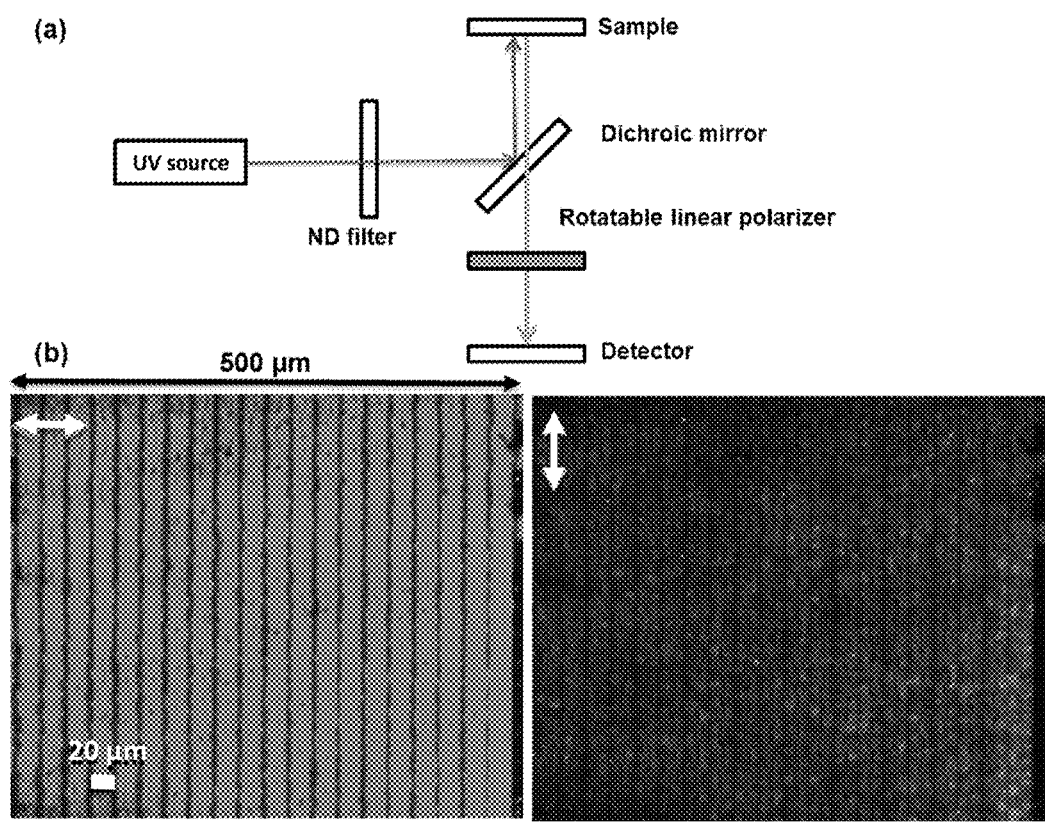
FIG. 10 schematically illustrates in FIG. 10(a) a fluorescence microscopy experiment set up and in FIG. 10(b) images of a deposited layer of nanorods in a polymer liquid crystal on ITO electrodes with the polarizer oriented parallel (left hand side) and perpendicular (right hand side) to the applied electric field, as used and obtained in an embodiment of the present invention.

By depositing or dipping the mixture comprising at least the nanorods and liquid crystals in the microchannels and applying an external electric field, the formed nanorods and liquid crystal assemblies are highly aligned. In embodiment of the invention an AC external electric field of 0.2 to 30 V/μm (rms) at 1 kHz is applied, preferably an external electric field of 3 V/μm to 20 V/μm (rms) at 1 kHz. Advantageously the applied external electric field declusters the nanorods in the vicinity of the electrodes, resulting in a higher degree of alignment, in addition to the self-alignment provided by the liquid crystal molecules. This effect of the presence of liquid crystal molecules is for instance illustrated in FIG. 5. FIG. 5 shows fluorescence microscopy images of aligned nanorods assemblies using methods according to embodiments of the present invention where a high external electric field of 20 V/μm (rms) is applied at a frequency of 1 kHz, whereby the mixture used comprises nanorods and glue, whereby the left image provides an image whereby the orientation of the polarizer is perpendicular to the alignment of the nanorods, and whereas the right image provides an image whereby the orientation of the polarizer is parallel to the alignment of the nanorods. The fluorescence microscopy setup used in illustrated schematically in FIG. 10(a). Using glue as a matrix for the nanorods, instead of a liquid crystal, provided a polarization ratio of 0.3 which is lower than the polarization ratio obtained using mixtures of the present invention comprising liquid crystals, which were 0.6. Therefor the use of liquid crystal as a matrix material for the nanorods assemblies improves the alignment of nanorods assemblies accordingly.

Example of a Mixture Comprising at Least Nanorods in a Non-Reactive Liquid Crystal According to Embodiments of the Present Invention Using at Least One Substrate FIGS. 6A-D illustrate the effect applying an electric filed and the strength thereof on deposited mixtures according to the present invention, said mixture comprising at least nanorods and a non-reactive liquid crystal.

Figure 6A:
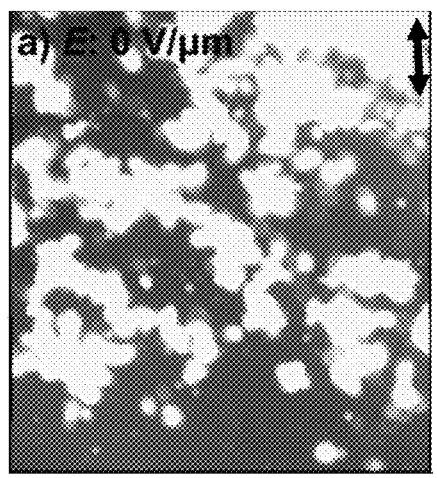
FIG. 6A to FIG. 6D provide fluorescence microscopy images of nanorods and non-reactive liquid crystal aligned assemblies according to the present invention.
Figure 6B:
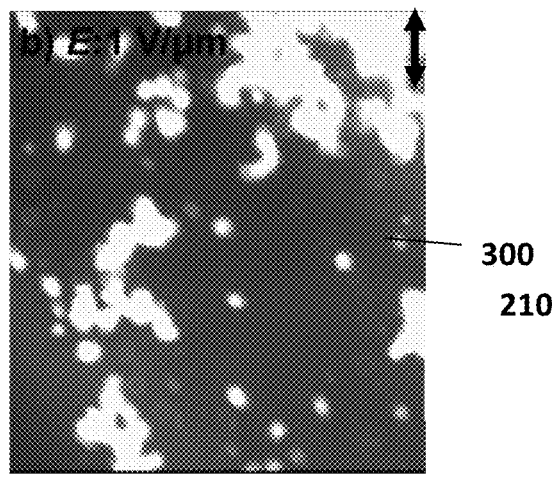
Figure 6C:
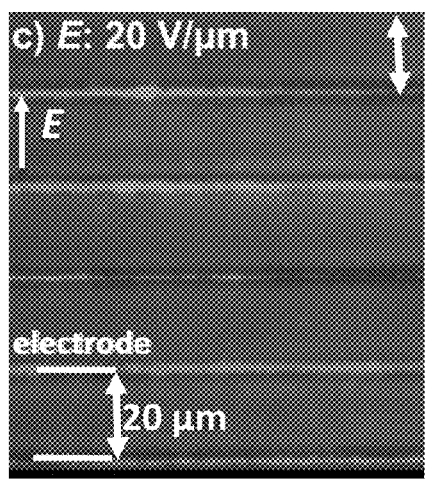
Figure 6D:
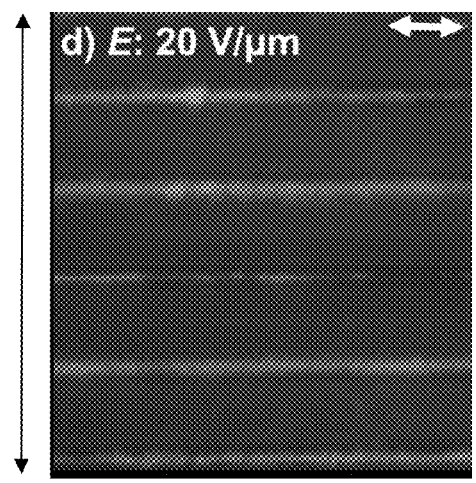

A nanorod suspension in non-reactive liquid crystal is deposited by drop casting (i.e. drop deposition) on a substrate with interdigitated electrodes. The orientation is observed in the absence of and in the presence of an electric field by using the polarization fluorescence microscopy setup as illustrated in FIG. 10(a). FIG. 6(a) shows fluorescence microscopy images with bright clusters of nanorods that emit unpolarized light whereby no electric field (E=0 V/µm) is applied. By applying a low electric field of 1V/µm, the liquid crystal director aligns but the clusters of nanorods remain visible (see for instance FIG. 6b). By applying an AC electric field with a higher amplitude (i.e. 20 V/µm) the clusters advantageously disappear. When comparing the emission for polarizer parallel (left hand side) and perpendicular (right hand side) indicate that good alignment of the NRs is achieved (see for instance FIGS. 6c and 6d). The obtained polarization ratio for this example is 0.26.

Figure 7A:
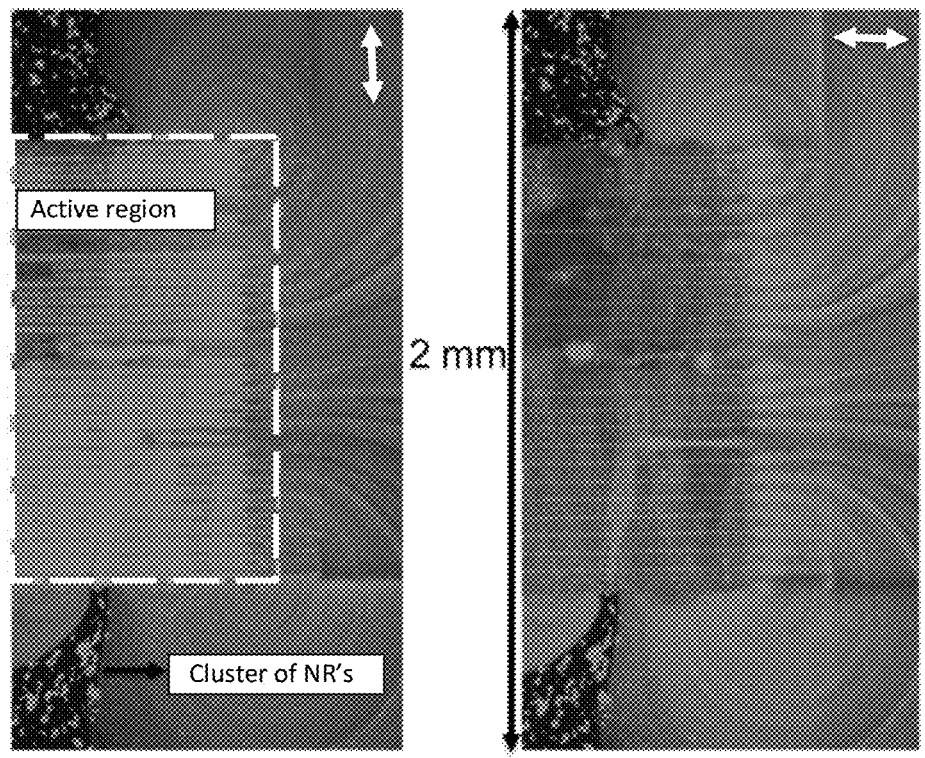
FIG. 7A shows fluorescence microscopy images of aligned nanorods assemblies with the polarizer oriented parallel (left hand side) and perpendicular (right hand side) to the applied electric field using methods according to embodiments of the present invention whereby the mixture used comprises nanorods and a reactive liquid crystal.
Figure 7B:
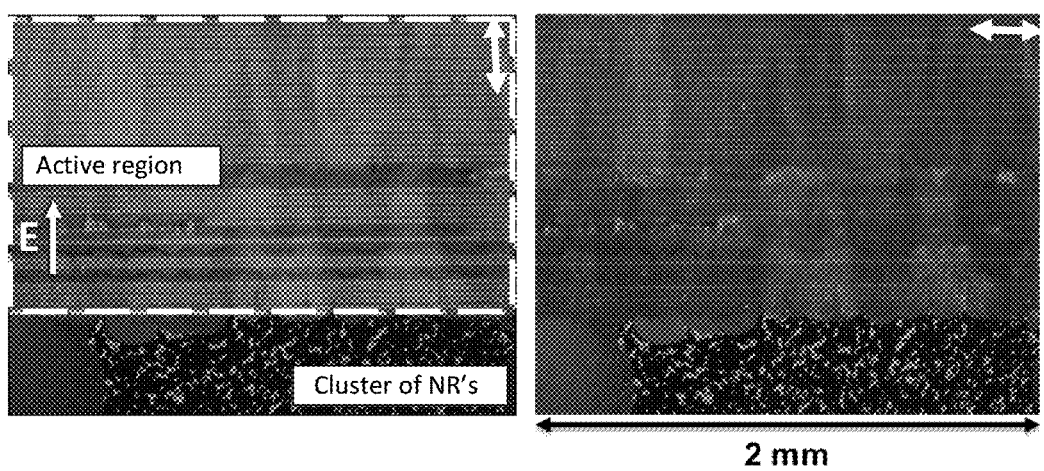
FIG. 7B shows fluorescence microscopy images of aligned nanorods assemblies with the polarizer oriented parallel (left hand side) and perpendicular (right hand side) to the applied electric field using methods according to embodiments of the present invention whereby the mixture used comprises nanorods and a reactive liquid crystal.
Figure 7C:
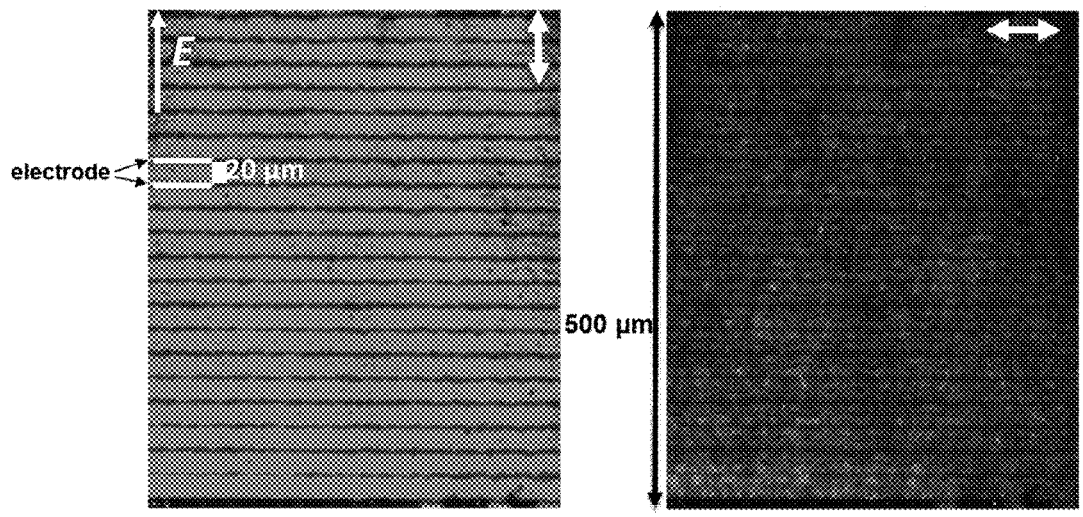
FIG. 7C shows fluorescence microscopy images of aligned nanorods assemblies with the polarizer oriented parallel (left hand side) and perpendicular (right hand side) to the applied electric field using methods according to embodiments of the present invention whereby the mixture used comprises nanorods and a reactive liquid crystal.
Figure 7D:
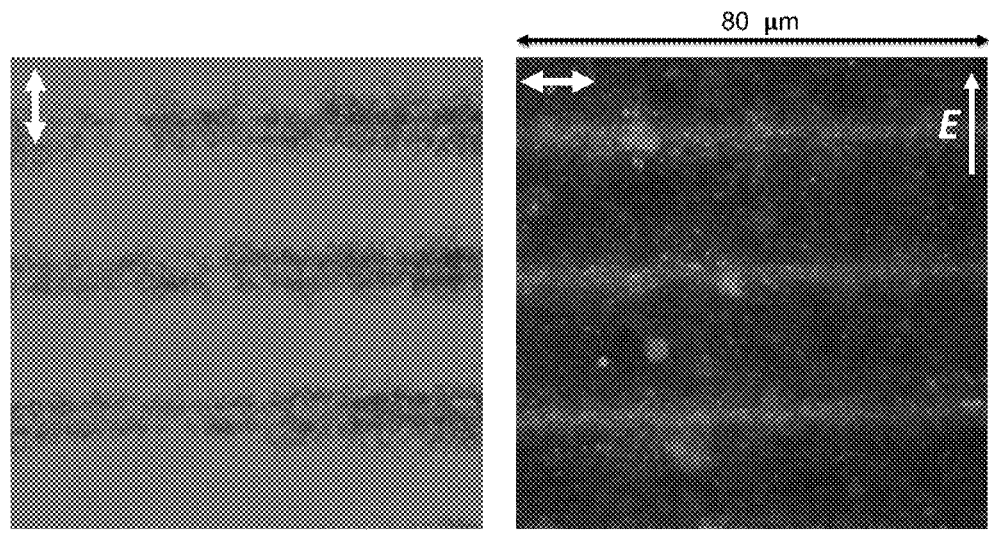
FIG. 7D shows fluorescence microscopy images of aligned nanorods assemblies with the polarizer oriented parallel (left hand side) and perpendicular (right hand side) to the applied electric field using methods according to embodiments of the present invention whereby the mixture used comprises nanorods and a reactive liquid crystal.

FIGS. 6A-6D illustrate that embodiments of the present invention advantageously provide declustering of the nanorods in the vicinity of the electrodes by applying a high, i.e. 20 V/µm (rms), external electric field to the mixture by providing electrodes in the vicinity or in contact with the mixture. Even when the liquid crystal is non-reactive. A strong electric field, i.e. ac electric field, is preferably applied parallel to the at least one substrate where advantageously the liquid crystal molecules and nanorods align parallel to the applied external electric field. FIG. 7A shows fluorescence microscopy images of aligned nanorods assemblies using methods according to embodiments of the present invention whereby the mixture used comprises nanorods and a reactive liquid crystal, whereby the left image provides an image whereby no external electric field is provided, and whereas the right image provides an image whereby a high external electric field is provided. FIG. 7B shows fluorescence microscopy images of aligned nanorods assemblies using methods according to embodiments of the present invention whereby the mixture used comprises nanorods and a reactive liquid crystal which are aligned using an high external electric field, whereby the left image provides an image whereby the orientation of the polarizer is perpendicular to the alignment nanorods and the right image provides an image whereby the orientation of the polarizer is parallel to the alignment of the nanorods. FIG. 7C shows fluorescence microscopy images of aligned nanorods assemblies using methods according to embodiments of the present invention whereby the mixture used comprises nanorods and a reactive liquid crystal, whereby said assemblies are illuminated with a UV source resulting in homeotropic alignment of the nanorods and non-reactive liquid crystal molecules, whereby the left image provides a scale of 800 µm and the right images a scale of 200 µm zooming into the active region. FIG. 7D provides fluorescence microscopy images at a scale of 2.3 mm of aligned nanorods assemblies using methods according to embodiments of the present invention whereby the mixture used comprises nanorods and a—reactive liquid crystal, whereby said assemblies are illuminated with a UV source resulting in homeotropic alignment of the nanorods and non-reactive liquid crystal molecules, whereby the left image is taken when no external electric field has been applied and the right image is taken when a high external electric field has been provided.

Figure 8A:
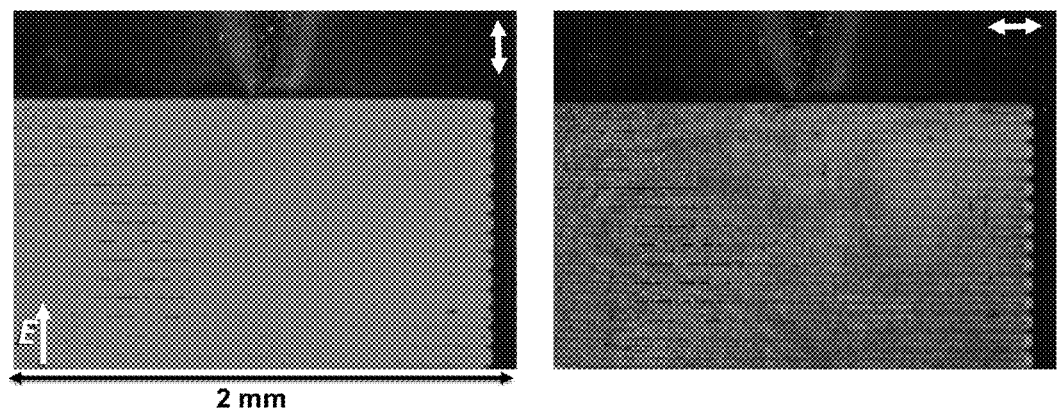
FIG. 8A shows a fluorescence microscopy image of aligned nanorods assemblies on a substrate according to embodiments of the present invention whereby the mixture used comprises nanorods and a reactive liquid crystal.
Figure 8B:
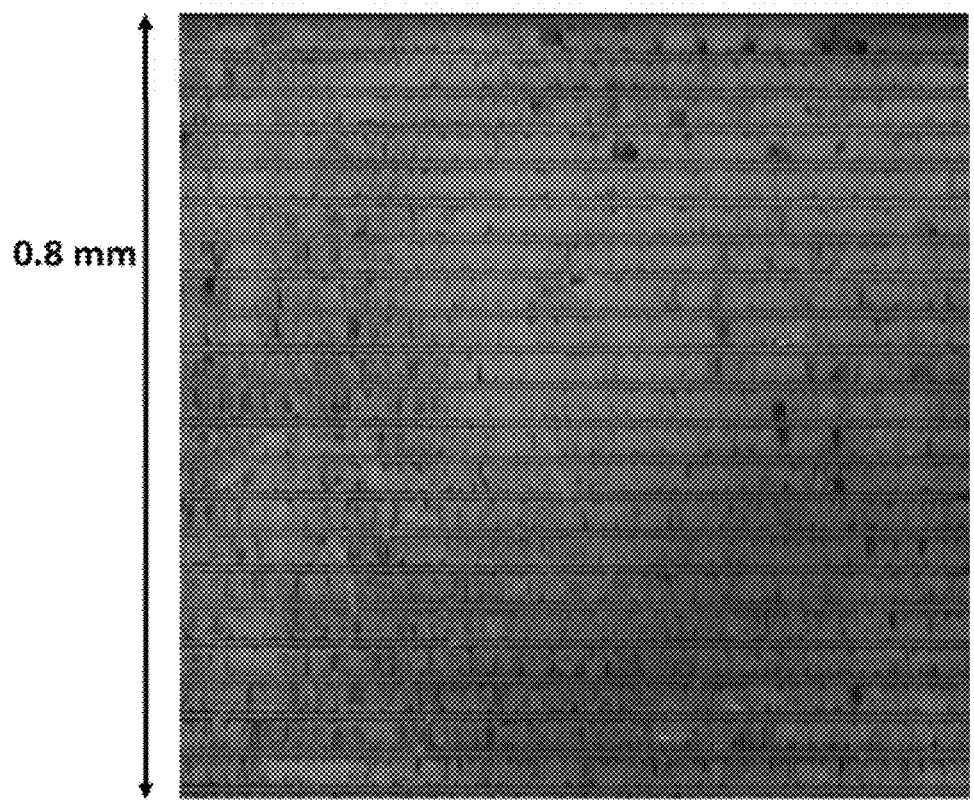
FIG. 8B shows fluorescence microscopy images of aligned nanorods assemblies on a substrate according to embodiments of the present invention whereby the mixture used comprises nanorods and a reactive liquid crystal.
Figure 8C:
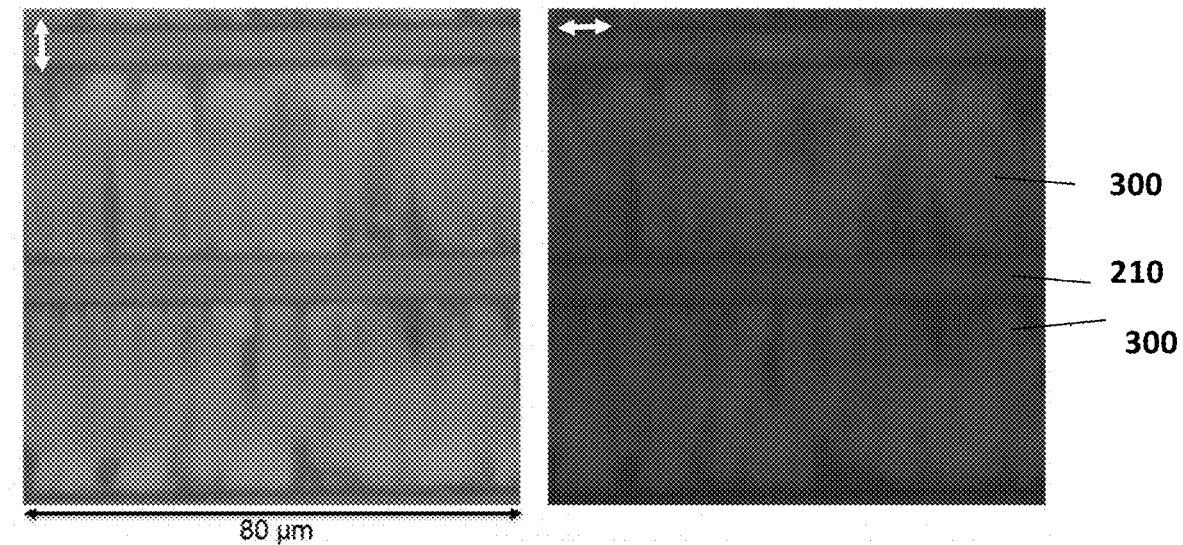
FIG. 8C provides zoomed images of FIG. 8B in the 80 μm range and FIG. 8D also in the 80 μm range but at the edge of the electrodes.
Figure 8D:
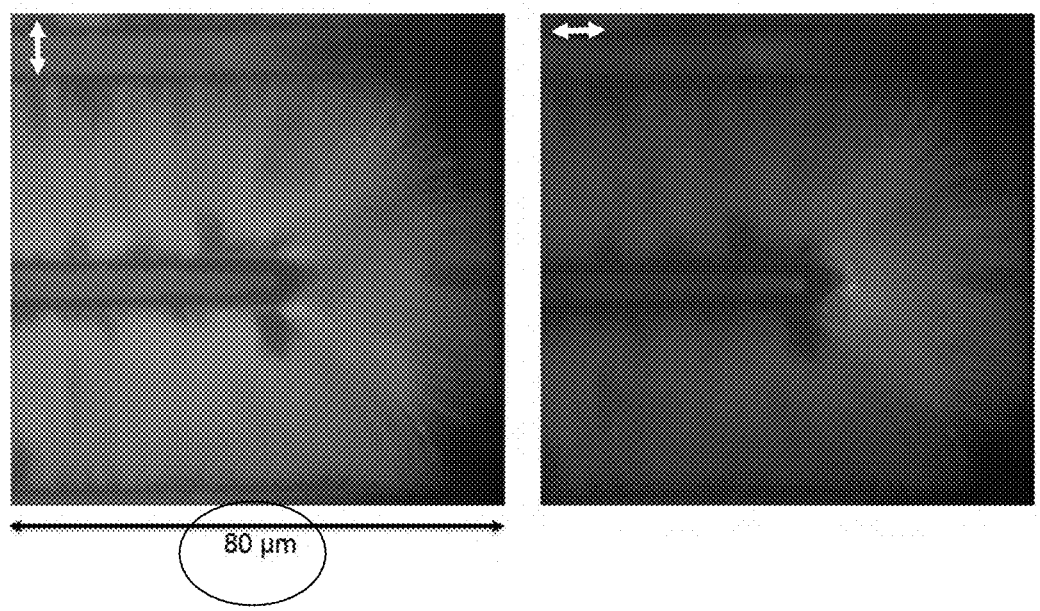

Advantageously, an even higher polarization ratio of 0.6 may be obtained by using a mixture according to embodiments providing a mixture comprising at least nanorods and a reactive liquid crystal. The results for the latter are provided in the FIGS. 8A-8D. FIG. 8A shows a fluorescence microscopy image of aligned nanorods assemblies on a substrate according to embodiments of the present invention whereby the mixture used comprises nanorods and a reactive liquid crystal and where a high external electric field has been applied, whereby the electrodes arrangement comprises electrodes of 6 µm in width and gap between the electrodes of 30 µm. FIG. 8B shows fluorescence microscopy images of aligned nanorods assemblies on a substrate according to embodiments of the present invention whereby the mixture used comprises nanorods and a reactive liquid crystal and where a high external electric field of 20 µm has been applied, whereby the left image provides an image whereby the orientation of the polarizer is perpendicular to the alignment of the nanorods and the right image provides an image whereby the orientation of the polarizer is parallel to the alignment of the nanorods, whereby the nanorods are oriented perpendicular to the finger electrodes. FIG. 8C provides zoomed images of FIG. 8B in the 80 µm range and FIG. 8D in the 80 µm range at the edge part of the electrode.

According to some embodiments films or sheets comprising a plurality of aligned nanorod and liquid crystal assemblies according to embodiments of the invention on the at least one substrate are preferably detached from the at least one substrate comprising at least an electrodes arrangement such that said substrate with the electrodes arrangement can be reused. Detachment of a film or layer comprising the nanorods and liquid crystal assemblies can be done by transferring the nanorods and liquid crystal assemblies into or onto a second substrate through a molding or contact printing process. The fluid can be deposited as: a melt which solidifies as a glassy and/or crystalline material; as a polymerizable monomer and/or macromere mixture which polymerized to a thermoplastic or thermoset; or as a cross-linkable resin, which is gelled to a rubbery state. The second substrate, acting as a flexible sheet comprising the nanorod and liquid crystal assemblies, can be rolled in a cylinder with the assemblies on the other surface of the cylinder and used in a roll-to-roll printing processes. In other embodiments the nanorods and liquid crystal assemblies can be obtained by using a flexible substrate for depositing the mixture of the present invention, whereby the flexible substrate with the assemblies can be rolled into a cylinder with the nanorods assemblies directed to the outer surface of the cylinder and used in a roll-to-roll printing process. In preferred embodiments the roll aligns the nanorod assemblies for instance by electrodes over which a potential difference is applied. Further down the roll the sheet may be solidified for instance by using a UV source. This is enabled for instance by a liquid crystal mixture, a that contains preferably reactive liquid crystal mesogens in the mixture, whereby the liquid crystal can be solidified by the use if a UV source. In some embodiments a photo-inhibitor may be used to inhibit polymerization before UV illumination is performed or a photo-initiator may be used to initiate polymerization by UV illumination. In other embodiments both photo-initiator and photo-inhibitor may be used.

The nanorods assemblies on the substrate can be in the form of a sheet with a plurality of nanorods and liquid crystal molecules assemblies, where the deposited and aligned nanorod assemblies of the present invention are solidified for instance by cross-linking, and can be used as a polarizing photonic device, such as a polarizing LED. The resulting sheet may be driven electronically, this is, by for instance injecting a current from both sides. This may be possible by for example using the appropriate electrodes on top and bottom and by adding injection layers. The mixture used may also be doped with hole transport materials, in this case a polarized organic/inorganic LED may be obtained. In addition, the resulting sheet 500 advantageously emits polarized fluorescence when illuminated with unpolarized light of an appropriate wavelength. Additionally, the resulting polarizing photonic device can comprise materials in addition to the nanorods and liquid crystal molecules that are deposited in the microchannels, simultaneously with or subsequently to the nanorods and liquid crystal molecules. These materials can be Au, Ag, Cu, Fe, Co, Ni, transition metal oxide, indium oxide, gallium oxide, CdSe, CdS, CdTe, ZnS, ZnSe, ZnTe, HgS, HgSe, HgTe, InP, InAs, GaP, GaAs, PbS, PbSe, PbTe, InCuS, InCuSe, InAgS, InAgSe, InAgTe, or any combination thereof. Other uses for the nanorods and liquid crystal molecule assemblies may include photo-detectors, solar cells, solar concentrators and thermoelectric applications.

Figure 9:
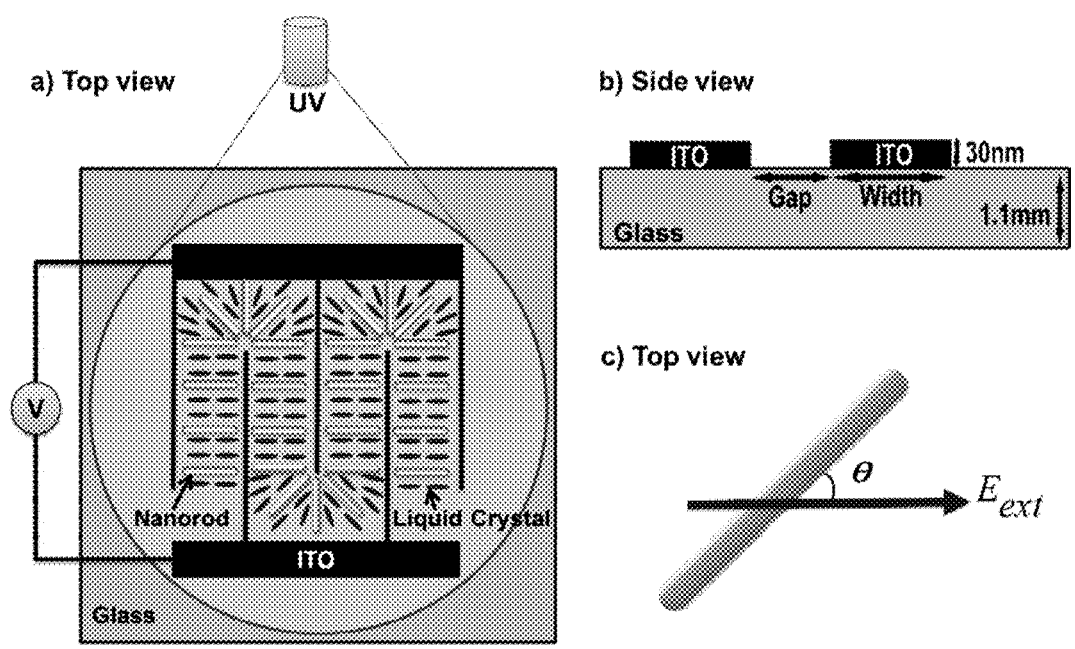
FIG. 9 schematically illustrates a top view (a) of substrate assembly comprising two parallel glass substrates with interdigitated ITO electrodes on one of the substrates according to embodiments of the present invention, whereby the substrate assembly is covered, for instance by dip coating, with a nanorods suspension in a reactive liquid crystal and illuminated by UV light in the presence of an electric field. A side view (b) and a top view (c) of the orientation of the external electrical field is also shown.

An example of an experimental setup showing a device with two parallel glass substrates with interdigitated ITO electrodes on one of the substrates is shown in FIG. 9(*a*). The area is filled with a nanorod suspension in a reactive liquid crystal and illuminated by UV light in the presence of an electric field. In the present example, the width of the ITO electrodes is 4 μm whereas the gap is 20 μm, schematically shown in FIG. 9(*b*) (not to scale). In FIG. 9(*c*) the angle θ is defined as the angle between the electric field and the nanorod long axis.

Example of Dip-Coating a Mixture Comprising Nanorods and Liquid Crystals According to Embodiments of the Present Invention Using at Least One Substrate At least one glass substrate (2.5 cm×2.5 cm) may be patterned for instance using optical lithography, providing a first electrodes arrangement of 30 nm thick ITO layer on a glass substrate. The ITO electrodes in different designs have an interdigitated finger pattern, with each line 2600 μm long and 6 μm wide, with a gap of 4 or 6 μm. The substrate may comprise a second electrodes arrangement, on to which a different, same or no external electric field may be applied. The latter advantageously enables the formation of tailored nanorods assemblies on one substrate.

Figure 15:
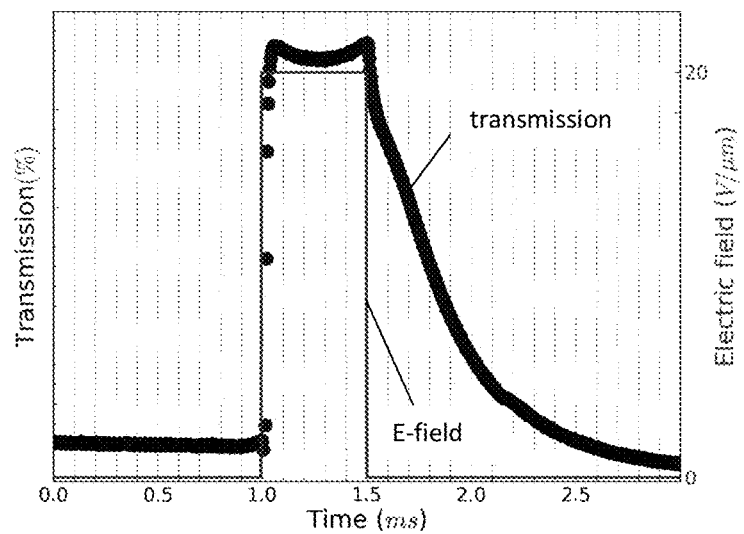
FIG. 15 illustrates transmission versus time of a CdSe/CdS NR suspension in a non-reactive liquid crystal when a pulse with amplitude of 20 V/μm is applied.

The time response of the transmission is shown in FIG. 15 when a block pulse with amplitude 20 V/μm is applied over a dispersion of nanorods in a non-reactive liquid crystal. The measurement indicates that the relaxation time of nanorods in the liquid crystal is below 700 μs.

Example of a Mixture Comprising at Least Nanorods in Liquid Crystals According to Embodiments of the Present Invention Using at Least Two Substrates According to some embodiments, the method can be based on providing a mixture of nanorods and liquid crystals in between two spaced substrates, whereby the substrates can comprise electrodes of an electrode arrangement such that the nanorods can be aligned by applying an electric field over the gap between the two substrates. Particular examples are illustrated below.

In one example, the substrate assembly provides two substrates and an electrode surface (e.g. not patterned) is provided on both substrates. The electrodes may be an ITO layer. The substrate assembly comprising the two substrates is preferably configured such to operate in an open and closed position. The closed position is providing when the two surfaces comprising the electrodes are brought in a mating position, where both surface face each other, whereby addition an opening or spacing is provided for instance by spacing means or by the shape of the substrates. The opening can receive the mixture and the nanorods and liquid crystal assembly can be obtained by providing an electric field over the opening, also referred to as gap. After solidification, the substrate assembly may then be provided in an open position, such that the assemblies can be reached and detached from the substrate assembly.

Figure 4:
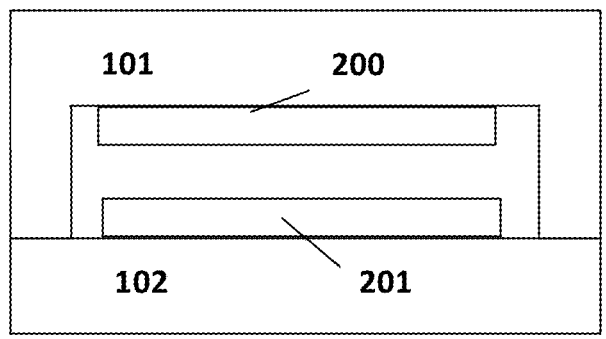
FIG. 4 schematically illustrates an alternative embodiment of a substrate assembly according to embodiments of the present invention.

In another example, the substrate assembly provides two substrates, preferably glass, where for each substrate a surface has been patterned. Patterning can be provided by for instance forming a patterned mask layer on the surface by photolithography process, lift-off process or imprint process and etching the mask layer into a structure having a plurality of protrusions by using the patterned mask layer as an etching mask, alternatively, forming a plurality of masks on the surface by spray or self-assembly and etching the surface into a structure having a plurality of protrusions by the masks formed on the surface. The patterning provides a first electrodes arrangement of 30 nm thick ITO layer on the first glass substrate and a second electrode arrangement of 30 nm thick ITO layer on the second glass substrate. The first and second electrode arrangements may the same or may be different in function of the application envisioned. One can choose the design of each of the electrodes arrangements, but preferably a finger pattern is used, for instance an interdigitated finger pattern, with each line 2600 μm long and 6 μm wide, with a gap of 4 or 6 μm. The first and second electrodes arrangements, which may be the same or different, can be configured such that different or same alignment conditions can be provided to the deposited mixture. The substrate assembly comprising the two substrates is preferably configured such to operate in an open and closed position. The closed position is providing when the two surfaces comprising the electrodes arrangements are brought in a mating position, where both surface face each other, whereby addition an opening or spacing is provided for instance by spacing means or by the shape of the substrates. FIG. 3 schematically shows an embodiment where spacing beads are provided to define an opening which can receive the mixture according to embodiments of the present invention. When the nanorods and liquid crystal assemblies according to the present invention are obtained the substrate assembly may then be provided in an open position, such that the assemblies can be reached and detached from the substrate assembly. FIG. 4 illustrates another embodiment of a substrate assembly of the present invention, where the opening for receiving a mixture is provided by the shape of the two substrates, for instance where a planar substrate is used and a U-shaped substrate The substrata assemblies according to embodiments of the present invention can be opened or closed by suitable means provided in the assembly, like for instance using magnetic materials or locking systems. Substrates used in embodiments of the invention may be planar and/or inclined to improve the fluid movement of a deposited mixture. It is an advantage of substrate assemblies according to the present invention that several sheets can be obtained by only one deposition step, resulting in less costs, man-hours spent and a higher yield of manufactured products.

In yet another set of embodiments, electrodes are not present on the substrate but can be brought in close vicinity of the substrate for inducing an electric field.

Example of a Suspended Mixture Comprising at Least Nanorods in a Reactive Liquid Crystal According to Embodiments of the Present Invention Using at Least Two Substrates.

Two glass substrates with interdigitated ITO electrodes are used to make a liquid crystal device with 10 μm spacing between the substrates. The thickness, length and width of the ITO electrodes in this specific example are 30 nm, 2600 μm and 4 μm respectively and the gap between two electrodes is 20 μm. The experimental setup and ITO pattern are schematically shown in FIGS. 9(a) and 9(b). A function generator (TTi-TG315) and a voltage amplifier (FLC electronics-A800X) are used to apply an AC electric field over the gaps between the electrodes. The deposition is realized by infiltrating a 1 w % NR suspension of the liquid crystal mixture into the device, for instance by dip-coating. An electric field (preferably 20 V/μm-rms at 1 kHz) is applied and after an interval of a few seconds, the device is illuminated with UV light during one minute in order to photopolymerize the reactive liquid crystal mixture while it is aligned. After polymerization, the voltage is switched off. Finally the substrate assembly is opened and one of the two glass substrates is removed and the polymer layer remains on one of the two substrates. The anisotropic emission of the deposited nanorods is observed using a fluorescence microscope. The nanorods are excited in the UV band (330-380 nm) using a Xenon lamp. The nanorod emission may be detected by an Andor CCD camera after passing through a dichroic mirror and a rotatable linear polarizer (see for instance the set up in FIG. 10). Fluorescence microscopy images of the nanorod layer are shown for the orientation of the polarizer (E-field of the light) parallel (FIG. 10(b)—on the left hand side) or perpendicular (FIG. 10(b) on the right hand side) to the applied electric field. The lines with low intensity are exactly the regions of the ITO lines electrode lines, which demonstrates that advantageously there are more nanorods between the electrodes than on the electrodes, due to the attraction of the nanorods by the strong electric field. The strongest photoluminescence is observed when the polarizer is parallel to the electric field, indicating that the nanorods are aligned along the electric field lines and that they emit light polarized along their long axis. The polarization ratio for regions with nanorods aligned according to the above procedure is about 0.6. The highest reported polarization ratio for a single CdSe/CdS NR is 0.75. The fact that the polarization ratio that we find (0.6) is smaller than the value for a single NR may is attributed to several factors: a limited degree of alignment, background fluorescence, loss of polarization due to scattering or unpolarized emission from aggregates. It may also be due to the fact that the transition dipole moment of the nanorods considered here is not perfectly aligned with the nanorod long axis.

Figure 11:
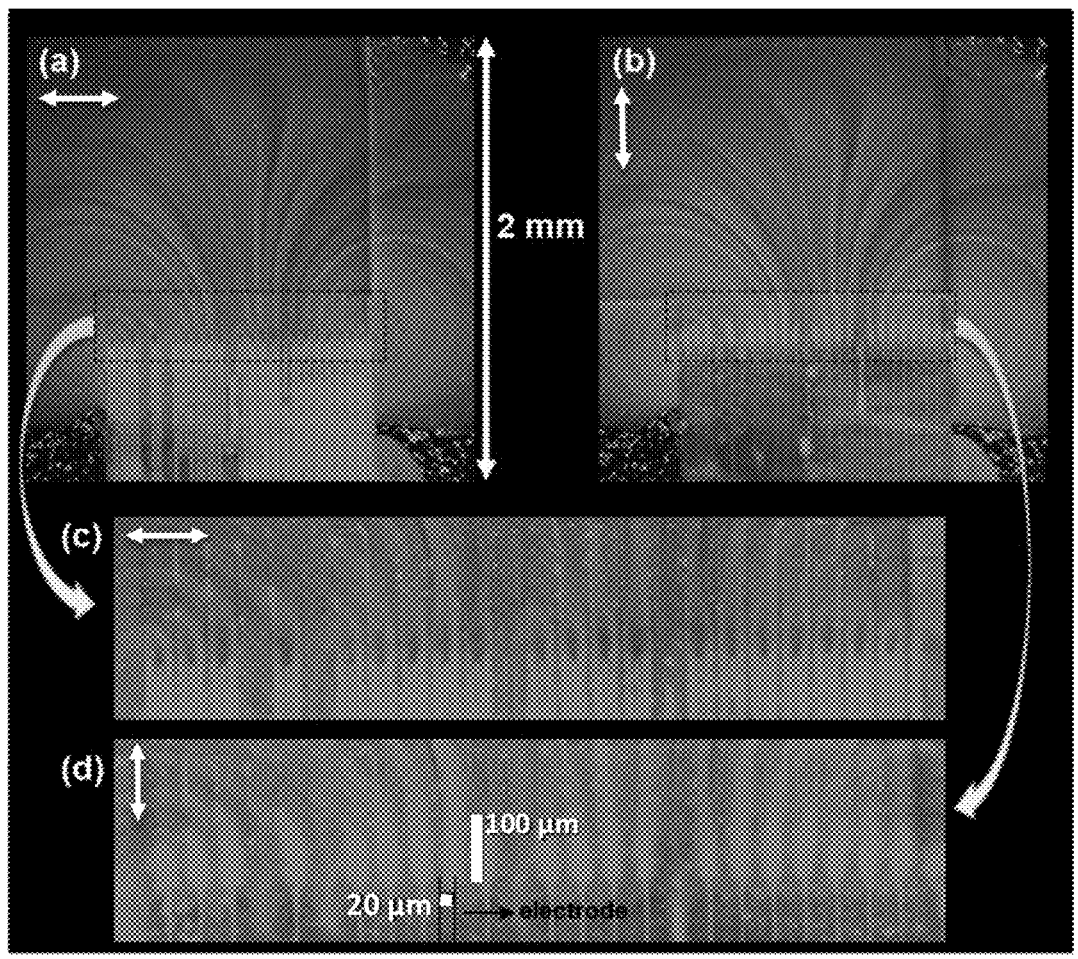
FIG. 11 illustrates fluorescence microscopy images of nanorods close to the end of the electrode lines with in FIG. 11(a) the polarizer is oriented perpendicularly to the line electrodes, in FIG. 11(b) the polarizer is oriented parallel to the line electrodes, and whereby FIGS. 11(c) and 11(d) provide close-ups of the electrodes of FIGS. 11(a) and 11(b) respectively. The applied voltage is 400 V, 1 kHz.
Figure 12A:
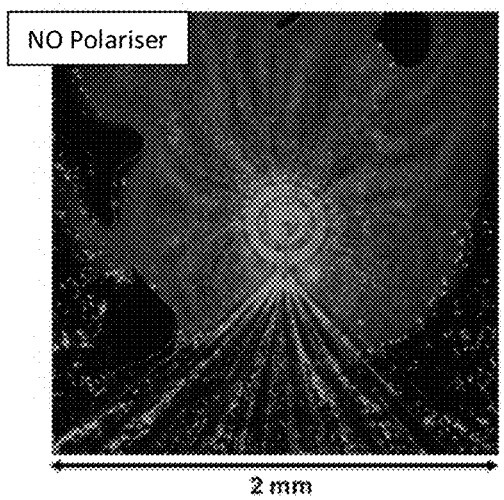
FIG. 12A and FIG. 12B illustrate fluorescence microscopy images of a liquid crystal film with nanorods near a region with circular electrodes (said electrodes have 3 μm width with a 20 μm gap) and applied voltage of 400 V, 1 kHz.
Figure 12B:
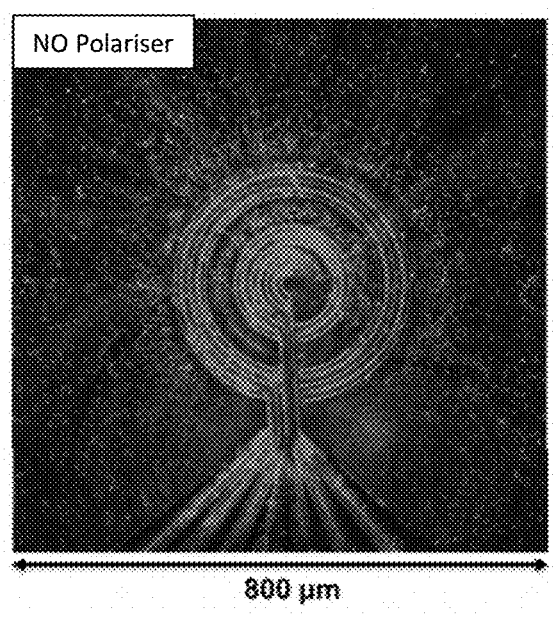

The electric field required to align nanorods in for instance dodecane is about 17 V/μm. When an electric field is applied to the mixture of nanorods and liquid crystal, the liquid crystals orient parallel to the electric field. This helps the nanorods to align at a much lower electric field. FIG. 11 shows fluorescence microscopy images of the aligned nanorods assemblies layer close to the edges of electrodes. The polarizer is oriented perpendicular (FIG. 11a) or parallel (FIG. 11b) to the electric field between the electrodes. Between the electrodes, the nanorods are aligned along the electric field. Note that a number of electrode lines are disconnected due to imperfections in the lithography and etching steps. Near the end of the electrodes the alignment follows the field, pointing away from the electrode tips (see for instance FIGS. 11c, 11d), while the electric field is much lower than 20 V/μm. This indicates that the liquid crystal in addition to the applied electrical field further helps to align the nanorods. The curved lines in the picture are due to flow in the cell which creates an inhomogeneity in the nanorod concentration. The orientation and the position of nanorods in space can be controlled using electrode patterns of a desired shape which is interesting from both from a scientific and a technological point of view. The fluorescence microscopy image in FIGS. 12A and 12B show the accumulation of aligned nanorods between the circular in-plane electrodes with 3 μm width and 20 μm gap, with no polarizer present. The film is made as same recipe as previous one with applied voltage of 400 V, 1 kHz. Note that again some of the electrodes are disconnected.

Figure 13:
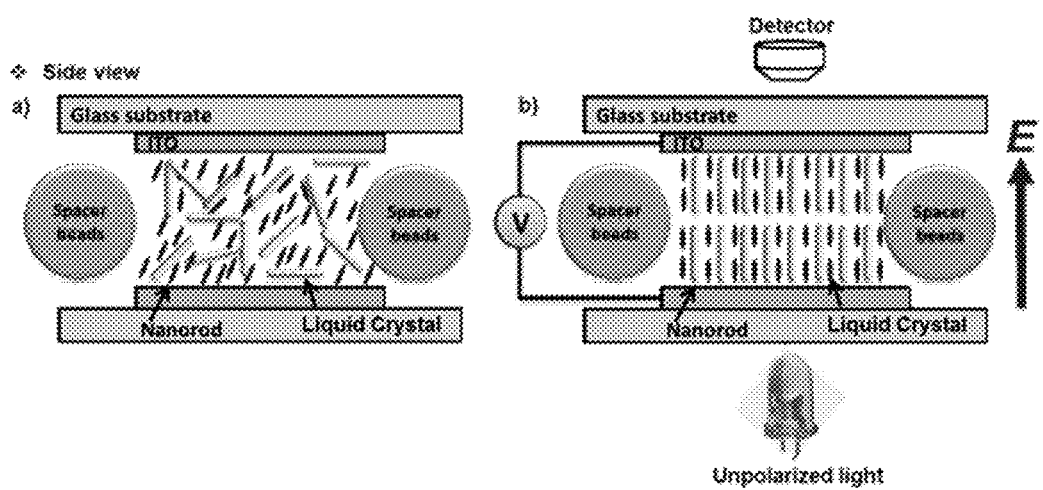
FIG. 13 schematically illustrates nanorods in suspension in a liquid crystal according to an embodiment of the present invention, whereby
Figure 14:
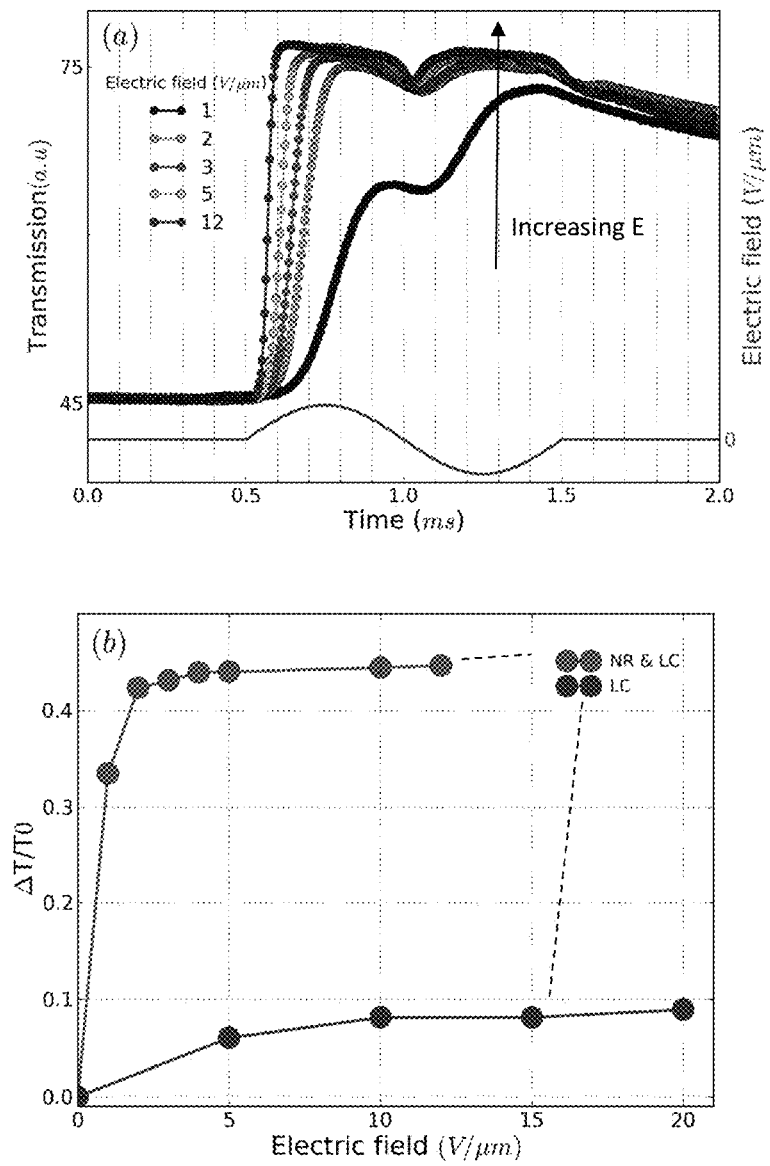
FIG. 14 illustrates in FIG. 14(a) a transmission measurement (dots) for a NR suspension between homogeneous electrodes for blue light (~470 nm) in the presence of an AC electric field with frequency 1 kHz and various amplitudes and in FIG. 14(b) the relative change of the transmittance for nanorod suspension and pure LC.
Figure 17:
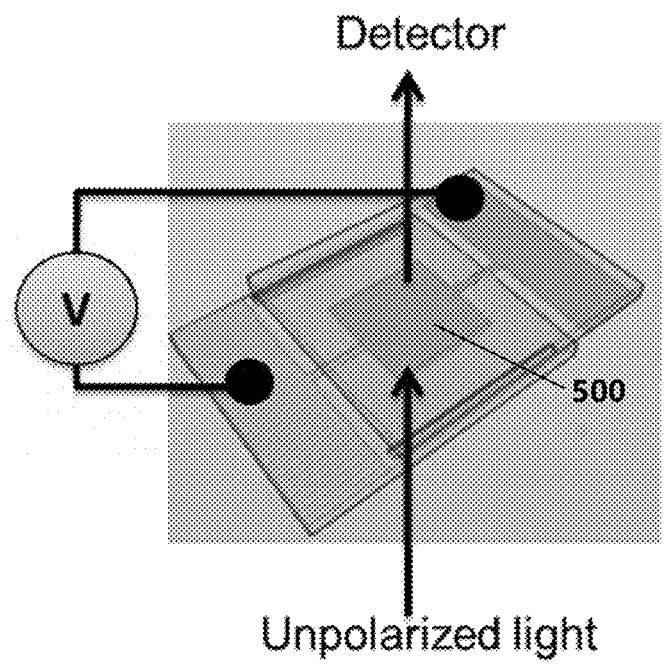
FIG. 17 illustrates a schematic overview of a fluorescence microscopy setup, as can be used in embodiments according to the present invention.

Example of a Suspended Mixture Comprising at Least Nanorods in a Nematic Liquid Crystal According to Embodiments of the Present Invention Using at Least Two Substrates The previous results are based on films that are photopolymerized and indicate the potential for applications using polarized light emission. In this section we will provide further evidence of the processes behind the controlled alignment of nanorods by using non-polymerizable liquid crystals and an applied electric field with is homogeneous and perpendicular to the substrates. For this reason a liquid crystal cell with 1 cm$^2$ ITO electrodes on both substrates is used with a cell gap of d=30 μm between them. The electric field is approximately homogeneous according to the relation E=V/d. The nanorods suspension in a non-reactive liquid crystal (i.e. MDA) is filled inside the cell by capillary force. There is random orientation of nanorods and liquid crystals in the off-state (i.e. with no applied electrical field) as confirmed by polarized fluorescence microscopy analysis and alignment of both nanorods and liquid crystals in an on-state (i.e. with an applied electrical field) along the electric field, as shown in FIGS. 13(a) and (b) respectively. The applied electric field to the ITO electrodes and the angle between the applied electric field and the nanorod long axis is shown in FIG. 13(c). The geometry of the setup is illustrated in FIG. 17. A wave generator in combination with a 200 times voltage amplifier is used to apply AC voltages with frequency between 50 Hz and 40 kHz over the electrodes, resulting in electric fields up to 20 V/μm. The transmission of blue light (using a 470 nm LED array) is measured using a photo detector with response time of 0.7 μs which is mounted on the microscope. The alignment of nanorods is now probed by using the anisotropic absorption properties of the nanorods instead of the anisotropic emission properties as in the previous section. The transmission of light is measured for a mixture, the mixture comprising a 1 wt % nanorod suspension in non-reactive liquid crystal, in the presence of varying AC electric fields. An electric field is applied to align also the nanorods. FIG. 14(a) shows an increase in transmission (due to a reduction in absorbance) when applying the electric field. This indicates that the nanorods align their long axes with maximal absorbance along the applied electric field, which is perpendicular to the polarization of the incident light. In order to eliminate the absorption and scattering of the liquid crystal in FIG. 14(a), the relative change of the transmittance (RCT) may be represented as $(T-T_{LC})/T_{LC}$ where $T_{LC}$ is the transmission of the cell in the presence of a small electric field (1 V/µm, 1 kHz) and T is the average transmission of the cell in the presence of a higher electric field. It is known that liquid crystals in the nematic phase exhibits considerable with a wavelength dependency of λ. Although the transmission loss due to scattering is very low at 470 nm, it is comparable with the absorption loss of the nanorods at the same wavelength. The relative change of the transmittance of nanorods in suspension and pure liquid crystal are obtained and shown in FIG. 14(b). The results show a sharp raise of alignment for an applied electrical field of 1 V/µm and almost saturated transmission for an applied electrical field of 2 V/µm, which is considerably lower than the field required for instance in dodecane (17 V/µm). As a result the environment of aligned liquid crystal molecules helps to align the nanorods at a lower electric field. It is an advantage of embodiments of the present invention that the alignment of the nanorods is stable and is maintained, e.g. after 2 ms.

In another aspect, the present invention also relates to an assembly of nanorods and liquid crystals, that is solidified and that comprises a high density of nanorods as well as a good homogeneity. Such an assembly may be obtained using a method as described in an embodiment of the first aspect. According to some embodiments, the assembly may be aligned such that it provides a polarization ratio in the range 0.3 to 0.65. In embodiments of whereby CdSe/CdS nanorods are used a polarization ratio of 0.6 was obtained, whereby the obtained polarization ratio of the nanorod assembly is thus smaller than the polarization ratio of a single CdSe/CdS nanorod which is 0.72 according to literature. It is an advantage of embodiments of the invention that nanorods assemblies are provided, which have high polarization ratios and can be used for LED and other photonic devices. The nanorods in the assembly may comprise CdSe/CdS, Au. Ag, Cu, Fe, Co, Ni, transition metal oxide, indium oxide, gallium oxide, CdSe, CdS. CdTe, ZnS, ZnSe, ZnTe. HgS, HgSe, HgTe, InP, InAs, GaP, GaAs, PbS, PbSe, PbTe. InCuS, InCuSe, InAgS, InAgSe, InAgTe, or any combination thereof and wherein the liquid crystal is a reactive or non-reactive liquid crystal. An advantage of embodiments of the present invention is that the area spanned by the nanorod assembly can have a surface area of at least 10 cm², e.g. at least 100 cm², e.g. at least 1000 cm². The assembly can be obtained in sheet form.

Figure 16:
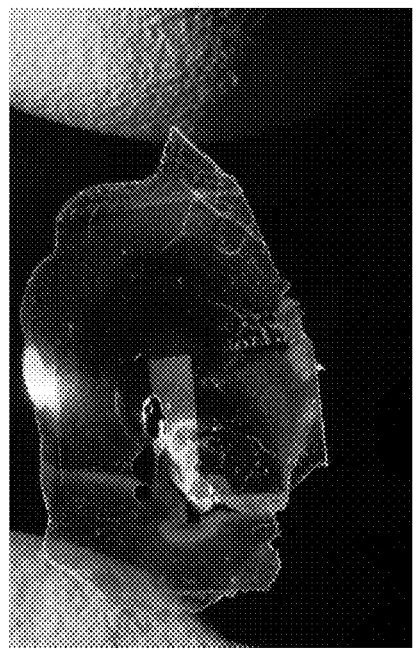
FIG. 16 illustrates an example of emitting nanorods, as can be obtained in an embodiment of the present invention.

FIG. 16 illustrates emission from a nanorod assembly as can be obtained in embodiments of the present invention.

Figure 18:
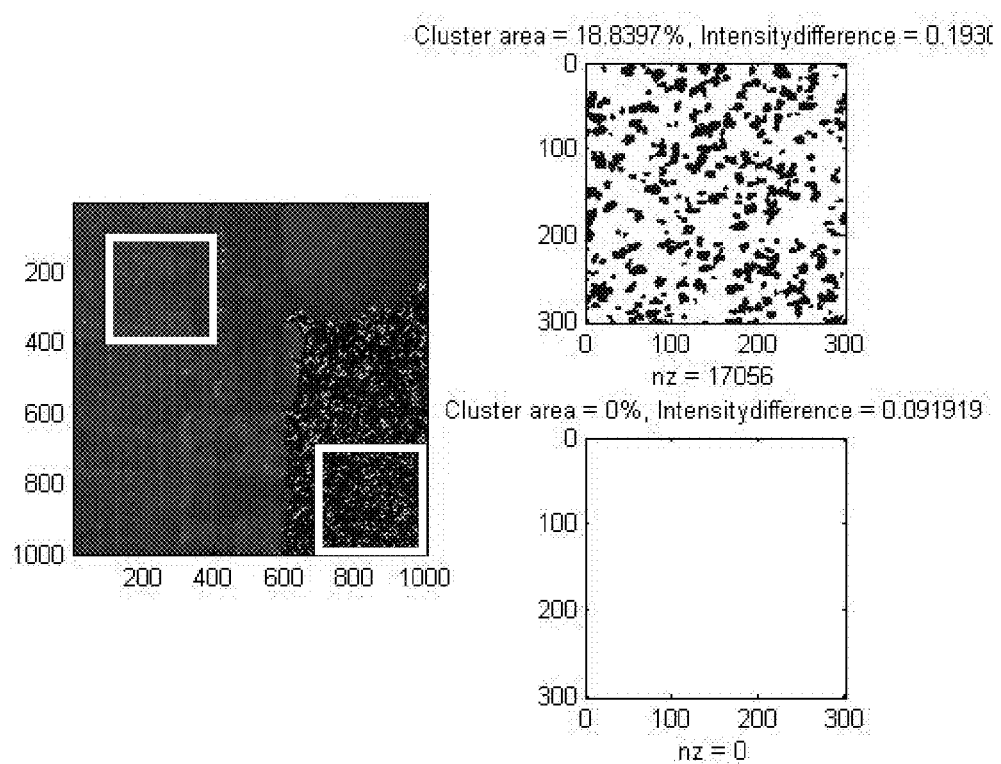
FIG. 18 illustrates a quantification of clusters in cluster region and active region.
Figure 19:
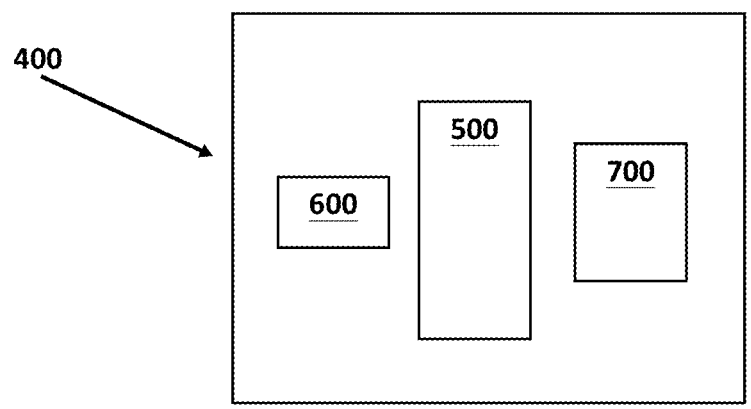
FIG. 19 schematically illustrates a down-conversion device according to an embodiment of the present invention.

FIG. 18 illustrates inhomogeneity of the region with clusters and active place with aligned NRs. We can define homogeneity number as:

$$h = \frac{\sqrt{\langle (I - I_{avg})^2 \rangle}}{I_{avg}}$$

Where I is the intensity of pixel and $I_{avg}$ is the average intensities of entire region. h is zero in case of perfect homogenous region and 1 for a mixture of only black and white pixels.

In our experiment h=0.092 for the selected area in active region and h=0.193 for the selected area in cluster region which indicates better homogeneity in active region. We can also count the clusters (spots with the area between 10 and 500 pixels) in these two regions. In active region the cluster area is 0% whereas in another region, the cluster area is 19%.

In yet another aspect, the present invention also relates to a polarizing photonic sheet, comprising a nanorod assembly as described above embedded within or resting upon a substrate. The substrate may comprise an inorganic or organic conductor, semiconductor, or insulator. It may comprise $Si_3N_4$, Si, $In_2O_3$, InAs, InP, GaP, GaAs, GaAlAs, gold, silver, graphene, and conducting polymers. It may comprise a polymer. The polymer may be an elastomeric network, a thermoplastic, or a thermoset. The elastomeric network may be a cross-linked polydimethylsiloxane (PDMS).

In still another aspect, the present invention relates to a down-conversion device 400, comprising at least one polarizing photonic sheet 500 as described above, at least one light emitting diode (LED) 600, and at least one polarizer 700. The LED may be for example a GaN LED and the polarizing photonic sheet comprises CdSe/CdS nanorods assemblies.

In yet another aspect, the present invention relates to the use of liquid crystal molecules in a nanorods assembly for aligning and declustering nanorods in a nanorods assembly under an external electric field.

REFERENCES

[100] substrate assembly
[101] a first substrate
[102] a second substrate
[150] a first surface
[151] a second surface
[200] a first electrodes arrangement
[201] a second electrodes arrangement
[210] electrode of an electrodes arrangement 200, 201
[20] microchannel
[30] a nanorod
[40] liquid crystal
[41] liquid crystal molecule
[50] mixture
[60] spacing means
[300] nanorods and liquid crystal assembly
[500] polarizing photonic sheet

The invention claimed is:

1. A method for preparing a nanorods assembly, the method comprising:
   providing a mixture comprising at least liquid crystal and nanorods;
   depositing said mixture on the surface of at least substrate comprising electrical contacts for applying an electric field,
   aligning and declustering said nanorods with their long axis along a preferred direction on said substrate resulting in a nanorods and liquid crystal assembly, said aligning and declustering being performed by applying an external alternating current electrical field having an electric field strength between 10 V/µm and 50 V/µm and a frequency between 100 Hz and 100 kHz.

2. The method of claim 1, whereby said applied external electric field has an electric field strength of between 10 V/µm to 20 V/um (rms).

3. The method of claim 1, wherein an electrode arrangement being a set of interdigitated electrodes on a single substrate is used.

4. The method of claim 3, whereby said at least one electrode arrangement comprises spaced-apart electrodes, the space between the electrodes defining microchannels at the surface of the at least one substrate for receiving the mixture.

5. The method of claim 1, wherein at least two substrates are used and wherein an electrode arrangement is present comprising electrodes being positioned on the at least two substrates and being spaced apart thus forming a microchannel in between the substrates.

6. The method of claim 4, wherein said microchannel(s) has a cross-section greater than the long axes of said nanorods.

7. The method of claim 5, wherein said microchannel(s) has a cross-section greater than the long axes of said nanorods.

8. The method of claim 1, wherein depositing comprises promoting a fluid flow of the mixture on the at least one surface of the substrate and/or wherein depositing comprises any of dip coating, doctor blading, spin coating, printing or providing a gravity flow of the mixture over the microchannel(s).

9. The method of claim 1, further comprising converting, after said aligning has occurred, said mixture into a solid material.

10. The method of claim 9, wherein said converting comprises solidifying said mixture using UV irradiation.

11. The method of claim 9, wherein said converting comprises solidifying said mixture and wherein, after solidifying, the solid material is separated from said surface of said at least one substrate, said nanorods assemblies being imbedded within the solid material.

12. The method of claim 9, wherein said mixture is a polymerizable material and wherein said converting comprises polymerization.

13. The method of claim 9, wherein said mixture is a melt and wherein said solid material is solidified glass.

14. The method of claim 9, wherein said mixture is a melt and wherein said solid material is a crystal from said melt.

15. The method of claim 1, wherein said method is performed as a roll-to-roll process whereby said aligning is performed by rolling the at least one substrate over a roll where said electric field is applied.

16. A nanorods assembly comprising a plurality of nanorods and liquid crystal molecules, wherein said nanorods and liquid crystal molecules are aligned along the same direction, the nanorods assembly being obtained using a method according to claim 1,
wherein the nanorods assembly is free of a surfactant and a concentration of the plurality of nanorods in the liquid crystal is 2% by weight.

17. A polarizing photonic sheet, comprising a nanorod assembly of claim 16 embedded within or resting upon a substrate.

18. A down-conversion device, comprising at least one polarizing photonic sheet of claim 17, at least one light emitting diode (LED), and at least one polarizer.

19. Use of liquid crystal molecules in a nanorods assembly for aligning and declustering nanorods in a nanorods assembly under an external alternating current electric field having an electric field strength between 10 V/$\mu$m and 50 V/$\mu$m and a frequency between 100 Hz and 100 kHz.

20. A method for preparing a nanorods assembly, the method comprising:
providing a mixture comprising at least liquid crystal and nanorods;
depositing said mixture on the surface of at least substrate comprising electrical contacts for applying an electric field,
aligning and declustering said nanorods with their long axis along a preferred direction on said substrate resulting in a nanorods and liquid crystal assembly, said aligning and declustering being performed by applying an external alternating current electrical field having an electric field strength between 10 V/$\mu$m and 50 V/$\mu$m and a frequency between 100 Hz and 100 kHz,
wherein the nanorods have a radius of 1 to 100 nm and a length to radius aspect ratio of 2 to 21.5.

* * * * *

UNITED STATES PATENT AND TRADEMARK OFFICE
CERTIFICATE OF CORRECTION

PATENT NO. : 10,964,857 B2  
APPLICATION NO. : 15/578513  
DATED : March 30, 2021  
INVENTOR(S) : Kristiaan Neyts, Jeroen Beeckman and Mohammad Mohammadimasoudi Page 1 of 1

It is certified that error appears in the above-identified patent and that said Letters Patent is hereby corrected as shown below:

On the Title Page
Item (73), Assignee, change "UNIVERSITES GENT" to --UNIVERSITEIT GENT--

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*